United States Patent
Okumura

(10) Patent No.: US 6,734,486 B2
(45) Date of Patent: May 11, 2004

(54) RECESSED PLUG SEMICONDUCTOR DEVICE AND MANUFACTURING METHOD THEREOF

(75) Inventor: Yoshinori Okumura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/222,429

(22) Filed: Dec. 29, 1998

(65) Prior Publication Data

US 2001/0048125 A1 Dec. 6, 2001

(30) Foreign Application Priority Data

Jul. 17, 1998 (JP) .......................... P10-203286

(51) Int. Cl.$^7$ ............................. H01L 27/108
(52) U.S. Cl. ................ 257/303; 257/296; 257/382; 257/377; 257/385; 438/244; 438/387
(58) Field of Search .............. 257/296, 303, 257/377, 385, 382, 71, 906, 758, 759, 304, 775; 438/244, 387, 672, 684, 685, 238, 239, 241, 253, 256, 329, 393, 396, 399, 443, 618, 620, 631, 657, 661, 675

(56) References Cited

U.S. PATENT DOCUMENTS

| | | | |
|---|---|---|---|
| 5,670,417 A | * | 9/1997 | Lambson et al. ............ 437/162 |
| 5,808,365 A | * | 9/1998 | Mori .......................... 257/775 |
| 5,959,319 A | * | 9/1999 | Iwasa ......................... 257/296 |
| 6,037,207 A | * | 3/2000 | Asano et al. ............... 438/241 |
| 6,083,824 A | * | 7/2000 | Tsai et al. ................... 438/629 |

OTHER PUBLICATIONS

Wolf et al., Silicon Processing for the VLSI Era, vol. 1: Process Technology, 1986, Lattice Press, p. 520.*

W. Wakamiya, et al., "Novel Stacked Capacitor Cell FOR 64Mb DRAM," VL'89, pp. 69–70.

K. Iguchi, et al., "A Novel DRAM Memory Cell With Inclined–Channel Transistor and Ring–Like Structure Produced Through Self-Aligned Storage Contact Process," VL '91, pp. 11–12.

K. Suguro, et al., "High Aspect Ratio Hole Filling With CVD Tungsten For Multi–Level Interconnection," Extended Abstracts of the 18$^{th}$ (1986 International) Conference on Solid State Devices and Materials, (1986), pp. 503–506.

* cited by examiner

Primary Examiner—George Fourson
Assistant Examiner—Julio J. Maldonado
(74) Attorney, Agent, or Firm—Oblon, Spivak, McClelland, Maier & Neustadt, P.C.

(57) ABSTRACT

An object is to prevent protrusion of a plug from an interlayer insulating film to prevent formation of a step between circuit parts exceeding a step height allowed in a planarization process and also to prevent formation of particles due to a protruded plug. An interlayer insulating film (11) is etched back over the entire surface under an etching condition in which the etching selectivity of a polysilicon plug (13) with respect to the interlayer insulating film (11) is 10, for example, to recess the polysilicon plug (13) to a given depth in a bit line contact hole (12) to form a recessed polysilicon plug (27).

8 Claims, 30 Drawing Sheets

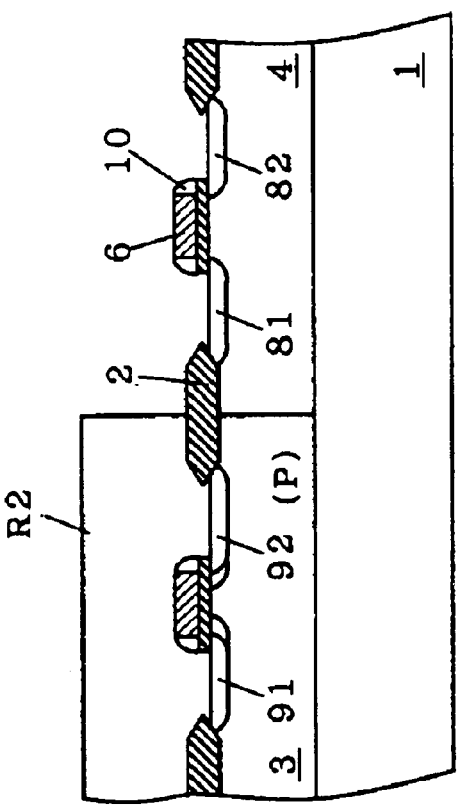
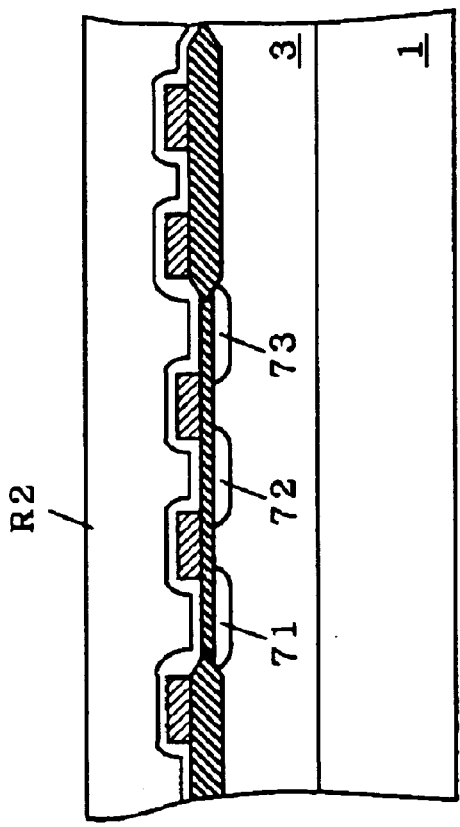
FIG. 3B
FIG. 3A

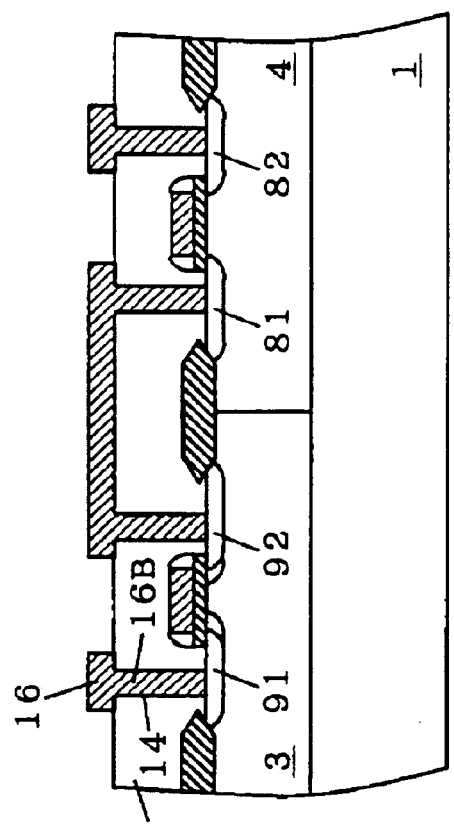
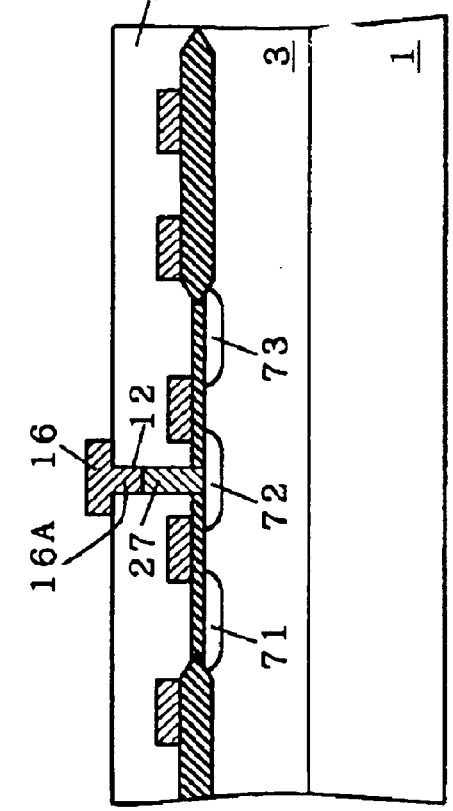
FIG. 6A
FIG. 6B

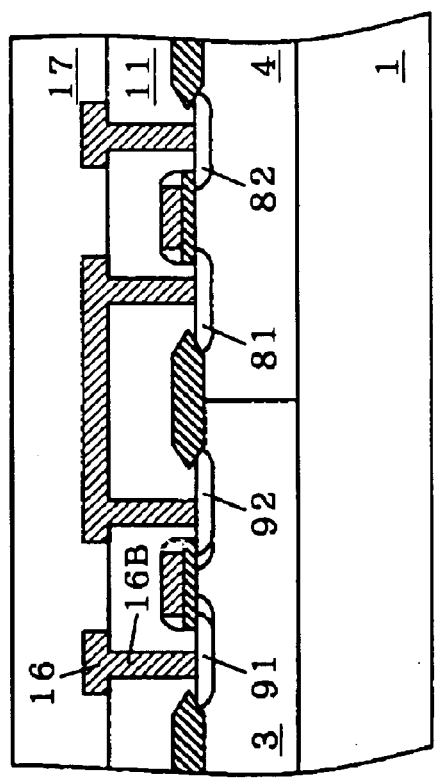
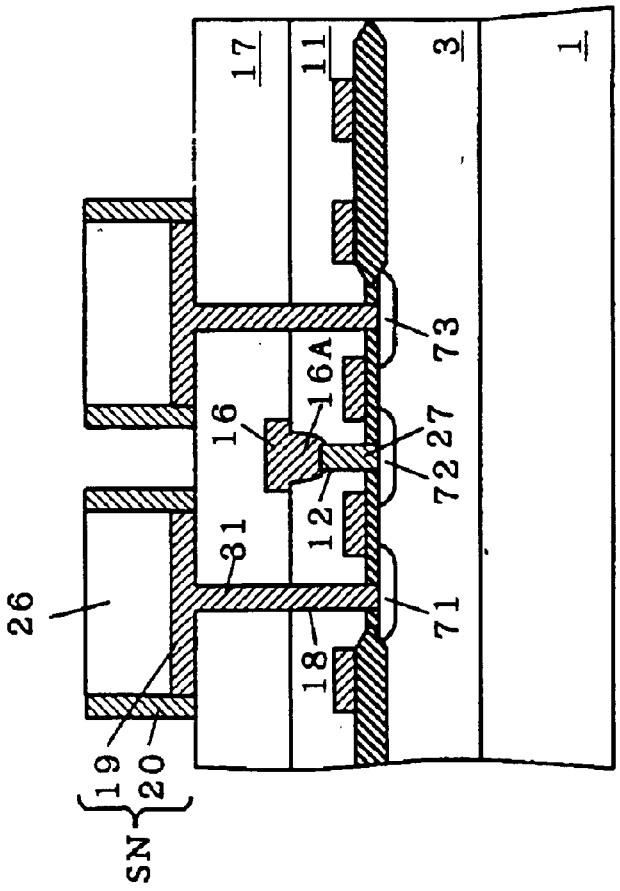
FIG. 18A
FIG. 18B

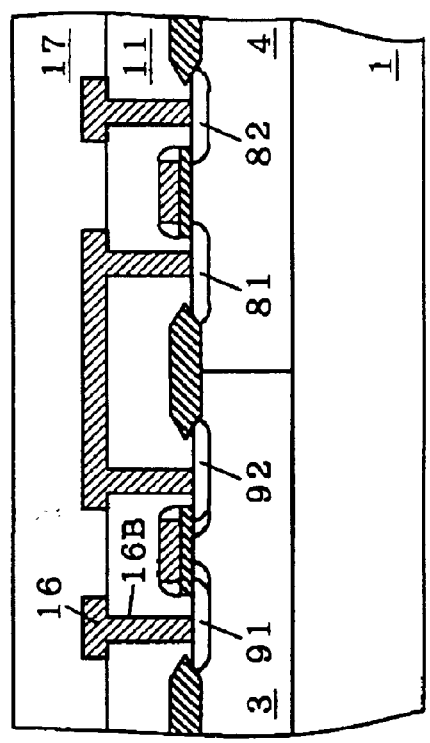
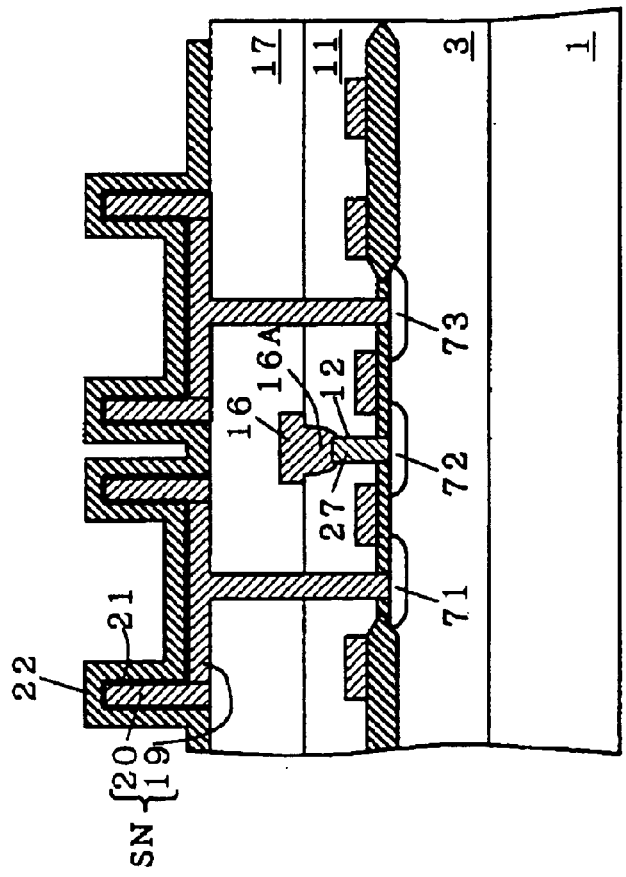
FIG. 19A
FIG. 19B

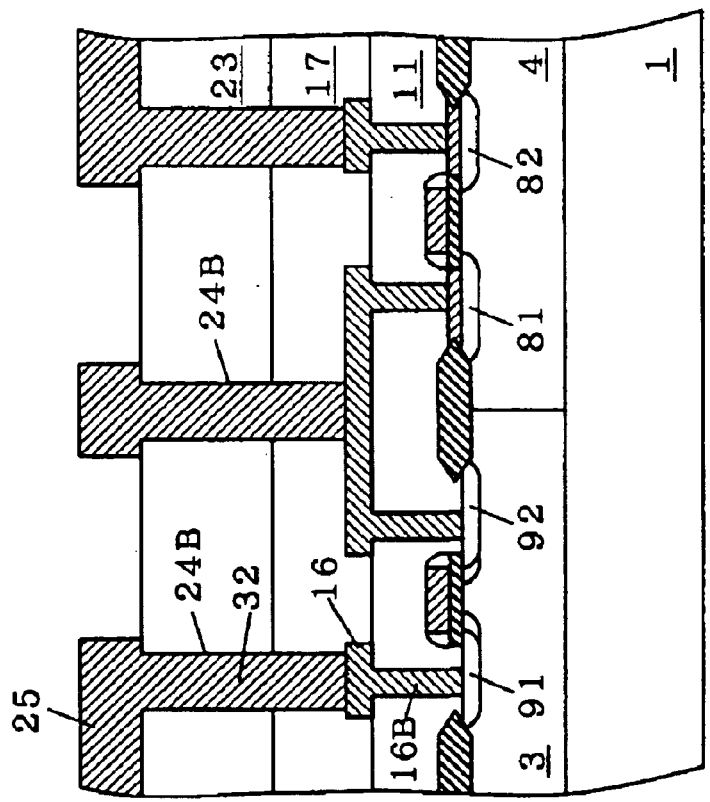
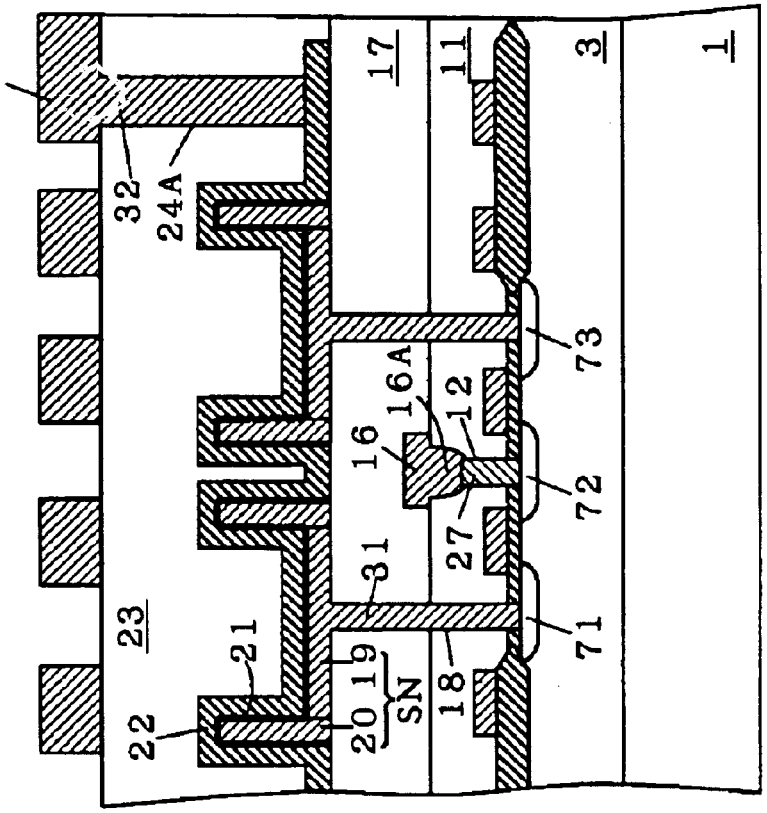

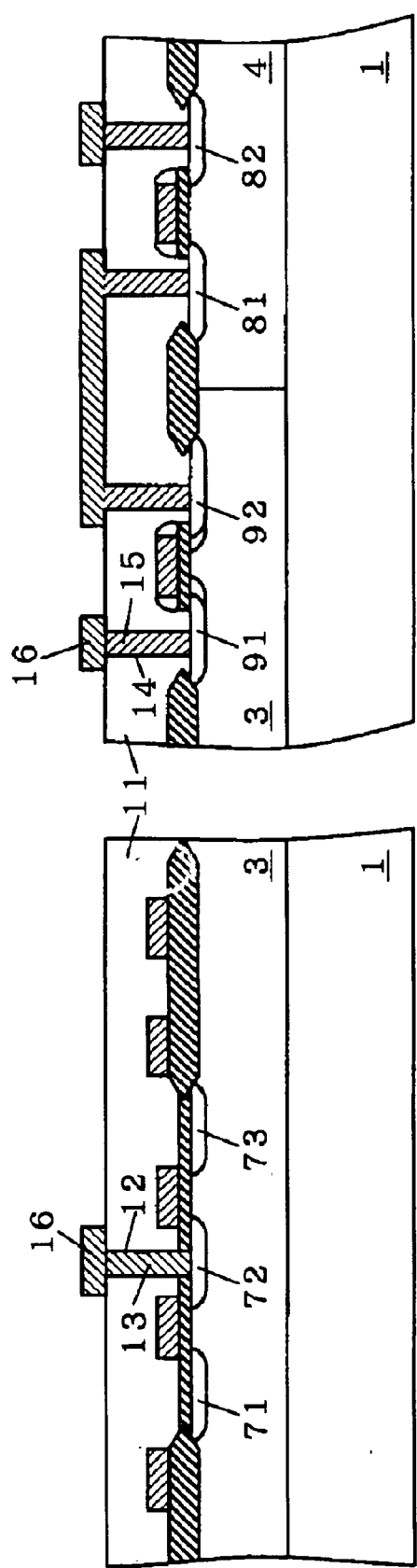

RECESSED PLUG SEMICONDUCTOR DEVICE AND MANUFACTURING METHOD THEREOF

BACKGROUND OF THE INVENTION

1. Field of the Invention

The present invention relates to semiconductor devices and manufacturing methods thereof, and particularly to a semiconductor device having a plurality of circuit parts with different structures, like a memory cell part and logic circuitry, mixed on one substrate, and a manufacturing method thereof.

2. Description of the Background Art

With the improvements toward higher integration and larger capacities in semiconductor devices, particularly in dynamic RAMs (DRAMs), three-dimensionalization of the memory cells have been studied after the 4M (Mega) DRAM generation for the purposes of maintaining soft-error resistance and securing capacitances of the capacitors. The structures for three-dimensional memory cells have been selected as the DRAM generation advances, and they are now being converged into stacked capacitor cells and trench capacitor cells.

In contrast with the trench capacitor cells in which a trench is formed in a silicon substrate to ensure the capacitances of capacitors with the depth, capacitors are stacked on a silicon substrate in the stacked capacitor cells to ensure the capacitances of the capacitors with the height. Typical stacked capacitor cells include the thick-film stacked capacitor cells which have been used from the 16M DRAM generation, the cylindrical capacitor cells which have been used from the 64M DRAM generation, the Fin capacitor cells, the thick-film rough-surface capacitor cells, etc. Among these stacked capacitor cells, a structure and a fabrication process of a DRAM 90 having cylindrical capacitor cells will be described referring to FIGS. 23A to 32B.

FIGS. 23A, 24A, 25A, 26A, 27A, 28A, 29A, 30A, 31A and 32A are partial sectional views showing the memory cell part of the DRAM 90 and FIGS. 23B, 24B, 25B, 26B, 27B, 28B, 29B, 30B, 31B and 32B are partial sectional views showing the peripheral circuit part including sense amps, decoders, etc., formed around the memory cell part in the DRAM 90.

First, in the process step shown in FIGS. 23A and 23B, a field oxide film 2 is selectively formed in a P-type silicon semiconductor substrate 1.

Then P-type impurity ions and N-type impurity ions are selectively implanted by using resist (not shown) as a mask to form a P-type well region 3 in the memory cell part and a P-type well region 3 and an N-type well region 4 in the peripheral circuit part in the P-type silicon semiconductor substrate 1.

Next, a gate oxide film 5 is formed on the P-type well region 3 and the N-type well region 4 in the part where the field oxide film 2 is not formed and gate electrodes 6 are formed selectively on the gate oxide film 5. At this time, word lines 61 are formed on the field oxide film 2 in the same process step as the gate electrodes 6.

Then N-type impurity (As or P) ions are implanted to a low dose ($1 \times 10^{13}$ to $1 \times 10^{14}$ cm$^{-2}$) into the P-type well region 3 right under the gate oxide film 5 in the memory cell part by using the gate electrodes 6 as masks to selectively form N-type source/drain regions 71, 72, 73, and N-type source/drain regions 74, 75 are selectively formed in a similar process in the P-type well region 3 right under the gate oxide film 5 in the peripheral circuit part.

Next, in the process step shown in FIGS. 24A and 24B, an oxide film OX1 is formed all over the surface and resist R1 is formed except on the P-type well region 3 in the peripheral circuit part, and the oxide film OX1 is then etched back by using this resist R1 as a mask to form side wall oxide films 10 on both sides of the gate electrode 6 on the P-type well region 3 in the peripheral circuit part.

Subsequently, by using the gate electrode 6 and the side wall oxide films 10 on the P-type well region 3 in the peripheral circuit part and the resist R1 as masks, N-type impurity ions are implanted to a high dose ($1 \times 10^{15}$ to $4 \times 10^{15}$ cm$^{-2}$) into the N-type source/drain regions 74 and 75 to form N$^+$-type source/drain regions 91 and 92.

Next, after removing the resist R1, in the process step shown in FIGS. 25A and 25B, resist R2 is formed except on the N-type well region 4 in the peripheral circuit part and the oxide film OX1 is etched back by using the resist R2 as a mask to form side wall oxide films 10 on both sides of the gate electrode 6 on the N-type well region 4 in the peripheral circuit part.

Subsequently, by using the gate electrode 6 and the side wall oxide films 10 on the N-type well region 4 in the peripheral circuit part and the resist R2 as masks, P-type impurity (B or BF$_2$) ions are implanted to a high dose ($1 \times 10^{15}$ to $4 \times 10^{15}$ cm$^{-2}$) into the N-type well region 4 to form P$^+$-type source/drain regions 81 and 82.

Next, the resist R2 is removed, and then as shown in the process step shown in FIGS. 26A and 26B, an oxide film is formed all over the surface and an interlayer insulating film 11 is formed by planarization. The interlayer insulating film 11 is referred to as an interlayer insulating film underlying bit lines so that it can be distinguished from other interlayer insulating films.

Next, a bit line contact hole 12 is formed through the interlayer insulating film 11 to reach the N-type source/drain region 72 in the memory cell part.

Next, a polysilicon layer, containing N-type impurities, is formed over the entire surface of the interlayer insulating film 11, and then the polysilicon layer is removed by CMP (Chemical Mechanical Polishing) except in the bit line contact hole 12 to form a polysilicon plug 13 in the bit line contact hole 12.

Next, in the process step shown in FIGS. 27A and 27B, bit line contact holes 14 are formed through the interlayer insulating film 11 to reach the N$^+$ source/drain regions 91 and 92 and the P$^+$-type source/drain regions 81 and 82 in the peripheral circuit part. Then a metal layer of TiN (titanium nitride) or W (tungsten), or a multi-layered film thereof, is formed all over the interlayer insulating film 11 and the metal layer is then removed by CMP except in the bit line contact holes 14 to form metal plugs 15 in the bit line contact holes 14.

Next, in the process step shown in FIGS. 28A and 28B, a metal layer of TiN or W, or a multi-layered film thereof, is formed all over the interlayer insulating film 11 and patterned by photolithography and etching to form metal bit lines 16. The metal bit lines 16 are so patterned that they are connected to the polysilicon plug 13 and the metal plugs 15.

Although the metal bit lines 16 in the peripheral circuit part do not always function only as bit lines, they are so named because they are formed in the same process as the bit lines in the memory cell part. Also, the bit line contact holes 14 are so named because they are connected to the metal bit lines 16, though they are not always connected to bit lines.

Although not shown in FIGS. 23B, 24B, 25B, 26B, 27B and 28B, a TG (Transfer Gate) wiring is formed in the peripheral circuit part in the same fabrication process as the word lines 61 (i.e., the gate electrodes 6), for example. Since the TG wiring is formed in almost the same layer as the gate electrodes 6, it may be electrically connected with the metal bit lines 16 by using the bit line contact holes 14.

That is to say, in the process step shown in FIG. 27B, a bit line contact hole (almost the same as the bit line contact holes 14) reaching the TG wiring through the interlayer insulating film 11 may be formed at the same time when forming the bit line contact holes 14, and then a metal plug 15 is buried also in the bit line contact hole reaching the TG wiring at the same time when the metal plugs 15 are buried in the bit line contact holes 14.

Next, in the process step shown in FIGS. 29A and 29B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the interlayer insulating film 17 with $N^+$ polysilicon into which N-type impurities are introduced to a high concentration, for example, the conductor layer for the formation of storage nodes is also buried in the storage node contact holes 18 to form buried layers 31.

Then a thick insulating film is formed all over the surface and then the conductor layer for the formation of storage nodes and the thick insulating film are removed through a process of photolithography and etching, leaving bottom films 19 forming the bottom of the storage nodes and the thick insulating film on the bottom films 19. Now the thick insulating films on the bottom films 19 are called insulating films 26 for the formation of cylindrical capacitors.

Next, in the process step shown in FIGS. 30A and 30B, a conductor layer for the formation of storage nodes is formed again all over the surface and is selectively removed by etch back so that it is left only around the bottom films 19 and insulating films 26 for the formation of cylindrical capacitors. The remaining parts of the conductor layer for the formation of storage nodes form side films 20 serving as side walls of the storage nodes. The bottom films 19 and the side films 20 form storage nodes SN.

Next, only the insulating films 26 for the formation of cylindrical capacitor are removed and a capacitor gate insulating film 21 is formed on the surface of the bottom films 19 and the side films 20 in the process step shown in FIGS. 31A and 31B. Then a conductive film for the formation of cell plate is formed all over the surface and the conductive film for cell plate formation is left only in the memory cell part through a process of photolithography and etching. The remaining conductive film for the formation of cell plate forms a cell plate electrode 22.

Next, in the process step shown in FIGS. 32A and 32B, an oxide film is formed all over the surface and an interlayer insulating film 23 is formed by planarization. The interlayer insulating film 23 is called an interlayer insulating film underlying aluminum wiring so that it can be distinguished from other interlayer insulating films.

Next, an aluminum wiring contact hole 24A reaching the cell plate electrode 22 is formed in the memory cell part and aluminum wiring contact holes 24B reaching the metal bit lines 16 through the interlayer insulating films 23 and 17 are formed in the peripheral circuit part.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then, through a process of photolithography and etching, aluminum wiring 25 is formed on the interlayer insulating film 23 in the memory cell part and the peripheral circuit part to obtain a DRAM 90 having cylindrical capacitor cells.

Although not shown in FIGS. 28B, 29B, 30B, 31B and 32B, a BL (Bit Line) wiring is formed in the same fabrication process as the metal bit lines 16 in the peripheral circuit part, for example. Since it is formed in almost the same layer as the bit lines 16, the BL wiring and the aluminum wiring 25 may be electrically connected by using the aluminum wiring contact holes 24B.

Generally, with highly-integrated and large-capacity DRAMs, high resolution is required in photolithography, and therefore the focus margin is reduced as trade off.

Accordingly, if the difference in level at the pattern step becomes larger over the focus margin as the degree of integration increases and the capacity becomes larger, it is then very difficult to form wiring by photolithography. Especially, with stacked capacitor cells which are formed by stacking capacitors on a silicon substrate, the difference in level at the pattern step is noticeable, and it is therefore essential to reduce the step height. The interlayer insulating film 11, the interlayer insulating film 17 and the interlayer insulating film 23 therefore undergo planarization as shown in FIGS. 32A and 32B.

However, such a planarization process tends to cause the problem that the thickness of the interlayer films from the aluminum wiring to the silicon substrate becomes too thick, and then it will be quite difficult to make contact holes for connecting the aluminum wiring and the silicon substrate, or the aluminum wiring and the TG wiring. Accordingly, as shown in FIGS. 32A and 32B, in the peripheral circuit part, the aluminum wiring and the silicon substrate, or the aluminum wiring and the TG wiring, are electrically connected by the metal plugs 15 buried in the bit line contact holes 14 through the metal bit lines 16 and BL wiring (not shown).

However, the use of the metal plugs 15 in the peripheral circuit part and the use of the polysilicon plug 13 in the memory cell part may cause such inconveniences as described below.

That is to say, a process of removing the native oxide film at the bottom of the bit line contact holes 14 by etching is required after the bit line contact holes 14 are made and before the metal layer for the formation of metal plugs 15 is formed. This process is performed so as to make ohmic contact between the metal plugs 15 and the silicon substrate and to reduce the contact resistance. At this time, the interlayer insulating film 11 is also etched and the polysilicon plug 13 in the bit line contact hole 12 will partially protrude in the memory cell part.

The protrusion of the polysilicon plug 13 exists only in the memory cell part and not in the peripheral circuit part. When the polishing rate to the polysilicon plug 13 in the CMP is smaller than the polishing rate to the interlayer insulating film 11, trying to remove the protrusion of the polysilicon plug 13 in the CMP process for the formation of the metal plugs 15 will result in over polishing of the interlayer insulating film 11 in the peripheral circuit part. Then the interlayer insulating film 11 in the peripheral circuit part will be recessed like a dish, i.e., the so-called dishing phenomenon. Then the interlayer insulating film 11 cannot be made planar in the entirety of the memory cell part and the peripheral circuit part. This will result in the formation of a step exceeding the step height allowed in the planarization process between the memory cell part and the peripheral circuit part. This may in some cases exceed the focus margin in the formation of the bit lines by photolithography, and then the formation of the bit lines will be very difficult. The dishing phenomenon may occur in the memory cell part, depending on the polishing conditions (hardness of the polishing pad for CMP, kind of the abrasive).

Further, when the protrusion of the polysilicon plug 13 is not perfectly polished away, it may cause processing problem in the formation of the metal bit line 16. Now referring to FIGS. 33 to 35, the processing problem caused by the protrusion of the polysilicon plug 13 in the formation of the metal bit line 16 will be described.

That is to say, in the formation of the metal bit lines 16, resist pattern for bit line formation (called bit line resist pattern) is overlaid on the bit line contact holes 12 by photolithography. At this time, an overlay margin is set in the bit line resist pattern because it may be misaligned. However, a misalignment exceeding the overlay margin may take place. This situation is shown in FIG. 33.

FIG. 33 is a plane view showing the bit line resist pattern RP overlaid on the bit line contact hole 12 (i.e., on the polysilicon plug 13). Although a margin part MP for misalignment is formed in the bit line resist pattern RP, the bit line contact hole 12 is protruding out of the margin part MP.

FIG. 34 shows the section taken along the line AA in FIG. 33. As shown in FIG. 34, the polysilicon plug 13 protrudes from the interlayer insulating film 11 and a metal layer ML of TiN or W is formed thereon as a bit line material. Hence, the metal layer ML has a raised part and the bit line resist pattern RP is formed thereon. The bit line resist pattern RP is formed in the position shifted from the center of the polysilicon plug 13. Accordingly, as shown in FIG. 35, when the metal layer ML is etched by using the bit line resist pattern RP as a mask, the metal layer ML will be left like a side wall at the edge of the polysilicon plug 13 on the side uncovered by the bit line resist pattern RP. This residue of the metal layer ML will come off in the following process steps to form particles.

SUMMARY OF THE INVENTION

A first aspect of the present invention is directed to a semiconductor device comprising first and second circuit parts with different structures formed on a semiconductor substrate. According to the first aspect of the present invention, in the semiconductor device, the first circuit part comprises; a first contact hole formed through a first part of an interlayer insulating film formed on the semiconductor substrate, a recessed plug of a conductor having its one end electrically connected to the semiconductor substrate and its other end located in a recessed position in the first contact hole, and a first buried layer composed of almost the same material as an wiring layer formed on the first part of the interlayer insulating film, and buried in the first contact hole to electrically connect the wiring layer and the recessed plug, and the second circuit part comprises; a second contact hole formed through a second part of the interlayer insulating film formed on the semiconductor substrate, and a second buried layer composed of almost the same material as the wiring layer formed on the second part of the interlayer insulating film, and buried in the second contact hole to electrically connect the wiring layer and the semiconductor substrate.

Preferably, according to a second aspect of the present invention, in the semiconductor device, the first contact hole has an enlarged contact part whose opening diameter in a part from a main surface of the interlayer insulating film to the other end of the recessed plug is made larger than an opening diameter of the part in which the recessed plug is buried.

Preferably, according to a third aspect, in the semiconductor device, the recessed plug is composed of polysilicon as a material, and the wiring layer and the first and second buried layers are composed of metal as a material.

Preferably, according to a fourth aspect, in the semiconductor device, the first circuit part is a data holding part for holding data by accumulating charge in a capacitor, and the second circuit part is a peripheral circuit part operating in relation to the data holding part.

A fifth aspect of the present invention is directed to a method for manufacturing a semiconductor device having first and second circuit parts with different structures formed on a semiconductor substrate. According to the fifth aspect of the present invention, the semiconductor device manufacturing method comprises the steps of: (a) forming a first part and a second part of an interlayer insulating film in correspondence with portions to be the first and second circuit parts on the semiconductor substrate; (b) forming a first contact hole reaching the semiconductor substrate through the first part of the interlayer insulating film; (c) filling the first contact hole to form a plug of a conductor having its one end electrically connected to the semiconductor substrate; (d) etching the plug until its other end is recessed in the first contact hole to form a recessed plug buried in the first contact hole; (e) forming a second contact hole reaching the semiconductor substrate through the second part of the interlayer insulating film; and (f) when forming an wiring layer on the first and second parts of the interlayer insulating film, forming a first buried layer of almost the same material as the wiring layer in the first contact hole to electrically connect the wiring layer and the recessed plug, and forming a second buried layer of almost the same material as the wiring layer in the second contact hole to electrically connect the wiring layer and the semiconductor substrate.

Preferably, according to a sixth aspect of the present invention, the semiconductor device manufacturing method further comprises, prior to the step (e), the step of enlarging by wet etching an opening diameter of the first contact hole in a part from a main surface of the interlayer insulating film to the other end of the recessed plug to a size larger than the opening diameter of the part in which the recessed plug is buried to form an enlarged contact part.

Preferably, according to a seventh aspect, in the semiconductor device manufacturing method, the step (c) comprises the step of forming the plug by using polysilicon as a material, and the step (f) comprises the step of forming the wiring layer and the first and second buried layers by using metal as a material.

Preferably, according to an eighth aspect, in semiconductor device manufacturing method, the step (d) comprises the step of etching the plug under an etching condition in which etching selectivity of the plug with respect to the interlayer insulating film is 5 to 20.

Preferably, according to a ninth aspect, in the semiconductor device manufacturing method, the step (d) comprises the step of etching the plug until the other end reaches half of the depth of the first contact hole or lower.

According to the semiconductor device of the first aspect of the present invention, the first buried layer formed of almost the same material as the wiring layer is connected to the recessed plug of a conductor having its other end recessed in the first contact hole so as to electrically connect the wiring layer and the recessed plug. Accordingly, for example, when the recessed plug is formed of a material having physical properties equivalent to those of the semiconductor substrate and the wiring layer and the first buried layer are formed of a material with good electric conductivity, it is possible to prevent applications of physical stresses to the semiconductor substrate and also to reduce the electric resistance between the semiconductor substrate and the wiring layer.

According to the semiconductor device of the second aspect, the opening diameter of the first contact hole in the part from the main surface of the interlayer insulating film to the other end of the recessed plug is larger than the opening diameter of the part in which the recessed plug is buried. Accordingly, even if misalignment occurs when overlaying the wiring layer, i.e. resist pattern, in the formation of the wiring layer in the fabrication process, it is possible to suppress an increase in contact resistance between the wiring layer and the first buried layer by enlarging the opening diameter so that the increase in contact area between the wiring layer and the first buried layer is equal to or larger than the decrease in the contact area between the wiring layer and the first buried layer caused by the misalignment.

According to the semiconductor device of the third aspect, the recessed plug is formed of polysilicon. Accordingly, when the semiconductor substrate is formed of a silicon substrate, the physical properties of the recessed plug and the semiconductor substrate are close, which prevents applications of physical stresses to the semiconductor substrate. Further, since the wiring layer and the first and second buried layers are formed of metal, the electric resistance between the semiconductor substrate and the wiring layer is reduced.

According to the semiconductor device of the fourth aspect, the recessed plug is formed of polysilicon in the data holding part which is designed under strict layout conditions, which considerably prevents applications of physical stresses to the semiconductor substrate. Further, in the peripheral circuit part which is designed under relatively relaxed layout conditions and therefore relatively free from physical stresses, the second buried layer is formed of metal to reduce the electric resistance between the semiconductor substrate and the wiring layer.

According to the semiconductor device manufacturing method of the fifth aspect, a space defined by the other end of the recessed plug and the side wall of the first contact hole is formed in the first contact hole before the wiring layer is formed. For example, even when the native oxide film on the bottom of the second contact hole is removed by etching after the formation of the second contact hole and the interlayer insulating film is removed together at this time, the recessed plug will not protrude. This prevents the problem that when resist pattern is misaligned in the formation of the wiring layer, the material for the wiring layer remains as a residue like a side wall on the edge of a protruding plug and the residue comes off to cause particles. Further, the second buried layer is buried in the second contact hole at the same time as the formation of the wiring layer, which eliminates the necessity of the CMP process which has been required when a plug for the second contact hole is buried in a different process step from the formation of the wiring layer. This solves the problem that the CMP forms a step exceeding the step height permitted in the planarization process between the first circuit part and the second circuit part, which prevents the problem that the step height between the two exceeds the focus margin in the formation of the wiring layer by photolithography to hinder the formation of the wiring layer.

According to the semiconductor device manufacturing method of the sixth aspect, the opening diameter of the first contact hole in the part from the main surface of the interlayer insulating film to the other end of the recessed plug can be made larger than the opening diameter in the part in which the recessed plug is buried. Accordingly, even if misalignment occurs when overlaying the wiring layer, or resist pattern, in the formation of the wiring layer, it is possible to suppress an increase in contact resistance between the wiring layer and the first buried layer by enlarging the opening diameter so that the increase in contact area between the wiring layer and the first buried layer is equal to or larger than the decrease in the contact area between the wiring layer and the first buried layer caused by the misalignment.

According to the semiconductor device manufacturing method of the seventh aspect, the recessed plug is formed of polysilicon. Accordingly, when the semiconductor substrate is formed of a silicon substrate, the physical properties of the recessed plug and the semiconductor substrate are close, which prevents applications of physical stresses to the semiconductor substrate. Further, the wiring layer and the first and second buried layers are formed of metal, which reduces the electric resistance between the semiconductor substrate and the wiring layer.

According to the semiconductor device manufacturing method of the eighth aspect, it is possible to stably form the recessed plug in both of structural and processing aspects by etching the plug under etching conditions in which the etching selectivity of the plug with respect to the interlayer insulating film is 5 to 20.

According to the semiconductor device manufacturing method of the ninth aspect, the other end of the plug is etched until it reaches about half of the depth of the first contact hole, which provides a recessed plug which is stable in structure.

The present invention has been made to solve the above-described problems. In a semiconductor device having a plurality of circuit parts with different structures and in which layers (semiconductor layer, conductor layer) provided above and below an interlayer insulating film are electrically connected through a plug buried in the interlayer insulating film in the respective circuit parts, an object of the present invention is to prevent protrusion of the plug from the interlayer insulating film to prevent formation of a step exceeding the step height permitted in the planarization process between the circuit parts and also to prevent formation of particles due to the protrusion of the plug.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 10B are sectional views used to describe a manufacturing process according to a first preferred embodiment of the present invention.

FIGS. 15A to 20B are sectional views used to describe a manufacturing process according to a second preferred embodiment of the present invention.

FIGS. 23A to 32B are sectional views used to describe a conventional semiconductor device manufacturing process.

DESCRIPTION OF THE PREFERRED EMBODIMENTS

<A. First Preferred Embodiment>
<A-1. Manufacturing Process>

As a first preferred embodiment of the present invention, the structure and manufacturing process of a dynamic RAM (DRAM) 100 having cylindrical capacitor cells will be described referring to FIGS. 1A to 10B. The structure of the DRAM 100 is shown in FIGS. 10A and 10B showing the final process step.

FIGS. 1A, 2A, 3A, 4A, 5A, 6A, 7A, 8A, 9A and 10A are partial sectional views showing the memory cell part (data holding part) of the DRAM 100 and FIGS. 1B, 2B, 3B, 4B, 5B, 6B, 7B, 8B, 9B and 10B are partial sectional views showing the peripheral circuit part including sense amps, decoders, etc., formed around the memory cell part in the DRAM 100.

Figure 1B:
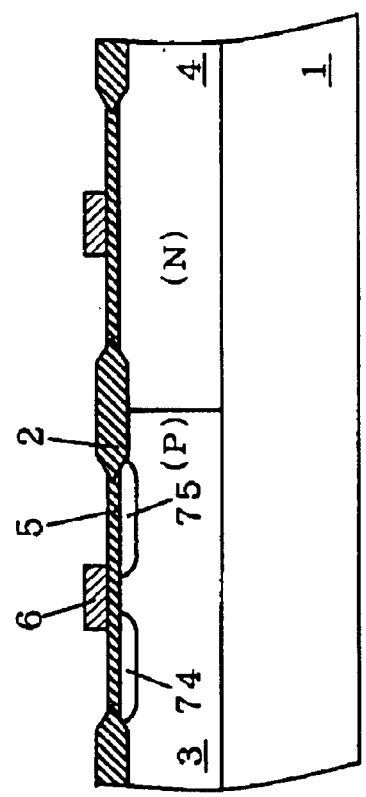
Figure 1A:
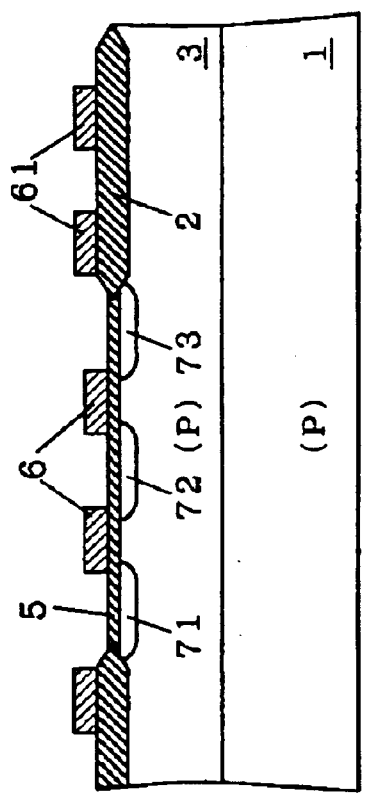

First, in the process step shown in FIGS. 1A and 1B, a field oxide film 2 is selectively formed in a P-type silicon semiconductor substrate 1.

Then P-type impurity ions and N-type impurity ions are selectively implanted by using resist (not shown) as a mask to form a P-type well region 3 in the memory cell part and a P-type well region 3 and an N-type well region 4 in the peripheral circuit part in the P-type silicon semiconductor substrate 1.

Next, a gate oxide film 5 is formed on the P-type well region 3 and the N-type well region 4 in the part where the field oxide film 2 is not formed and gate electrodes 6 are formed selectively on the gate oxide film 5. At this time, word lines 61 are formed on the field oxide film 2 in the same process step as the gate electrodes 6.

Then N-type impurity (As or P) ions are implanted to a low dose ($1 \times 10^{13}$ to $1 \times 10^{14}$ cm$^{-2}$) into the P-type well region 3 right under the gate oxide film 5 in the memory cell part by using the gate electrodes 6 as masks to selectively form N-type source/drain regions 71, 72, 73, and N-type source/drain regions 74, 75 are selectively formed in a similar process in the P-type well region 3 right under the gate oxide film 5 in the peripheral circuit part.

Figure 2B:
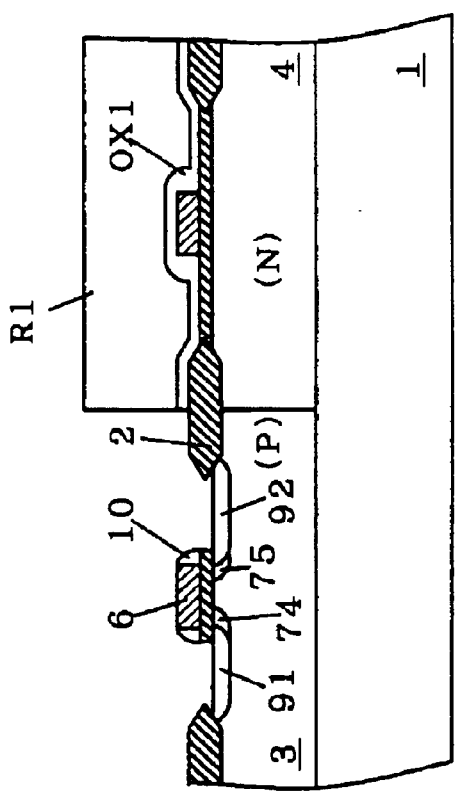
Figure 2A:
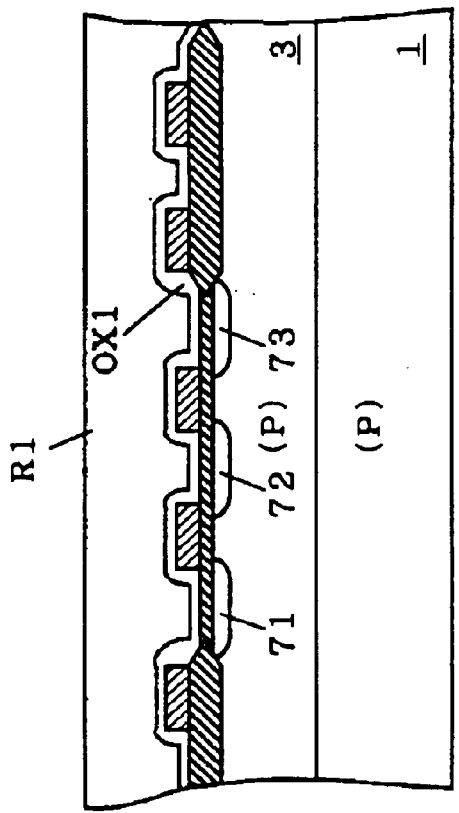

Next, in the process step shown in FIGS. 2A and 2B, an oxide film OX1 is formed all over the surface and resist R1 is formed except on the P-type well region 3 in the peripheral circuit part, and the oxide film OX1 is then etched back by using this resist R1 as a mask to form side wall oxide films 10 on both sides of the gate electrode 6 on the P-type well region 3 in the peripheral circuit part.

Subsequently, by using the gate electrode 6 and the side wall oxide films 10 on the P-type well region 3 in the peripheral circuit part and the resist R1 as masks, N-type impurity ions are implanted to a high dose ($1 \times 10^{15}$ to $4 \times 10^{15}$ cm$^{-2}$) into the N-type source/drain regions 74 and 75 to form N$^+$-type source/drain regions 91 and 92.

Next, after removing the resist R1, in the process step shown in FIGS. 3A and 3B, resist R2 is formed except on the N-type well region 4 in the peripheral circuit part and the oxide film OX1 is etched back by using the resist R2 as a mask to form side wall oxide films 10 on both sides of the gate electrode 6 on the N-type well region 4 in the peripheral circuit part.

Subsequently, by using the gate electrode 6 and the side wall oxide films 10 on the N-type well region 4 in the peripheral circuit part and the resist R2 as masks, P-type impurity (B or BF$_2$) ions are implanted to a high dose ($1 \times 10^{15}$ to $4 \times 10^{15}$ cm$^{-2}$) into the N-type well region 4 to form P$^+$-type source/drain regions 81 and 82.

Figure 4A:
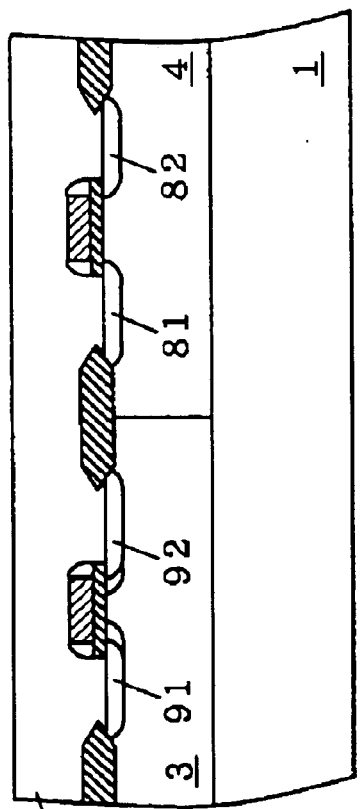
Figure 4B:
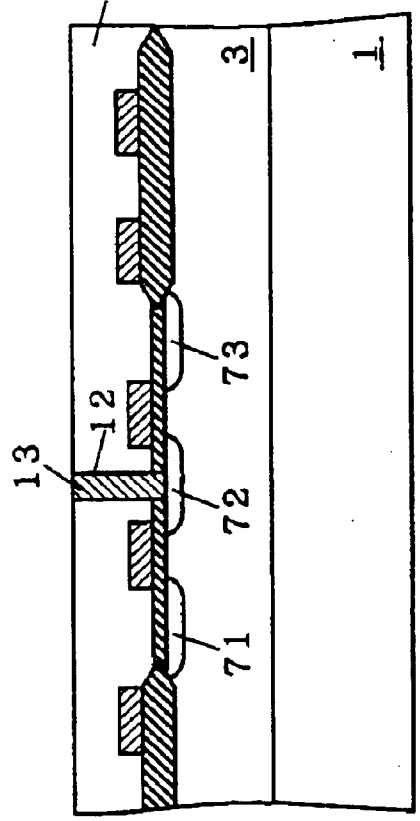

Next, the resist R2 is removed, and then as shown in the process step shown in FIGS. 4A and 4B, an oxide film is formed all over the surface and an interlayer insulating film 11 is formed by planarization. The interlayer insulating film 11 is referred to as an interlayer insulating film underlying bit lines so that it can be distinguished from other interlayer insulating films.

While the interlayer insulating film 11 and interlayer insulating films 17 and 23 shown later are insulating films formed with almost the same materials simultaneously in the memory cell part and the peripheral circuit part, the parts formed on the memory cell part are called a first part and the parts formed on the peripheral circuit part are called a second part to distinguish those formed in the memory cell part and those formed in the peripheral part.

Next, a bit line contact hole 12 (a first contact hole) is formed through the interlayer insulating film 11 to reach the N-type source/drain region 72 in the memory cell part.

Next, a polysilicon layer, containing N-type impurities, is formed over the entire surface of the interlayer insulating film 11, and then the polysilicon layer is removed by CMP (Chemical Mechanical Polishing) except in the bit line contact hole 12 to form a polysilicon plug 13 in the bit line contact hole 12.

Figure 5A:
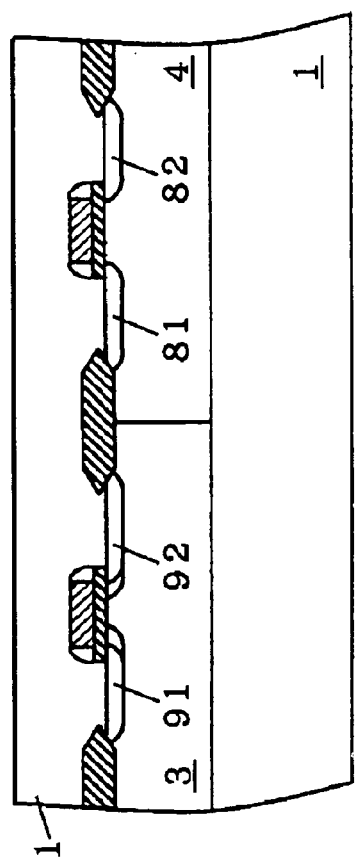
Figure 5B:
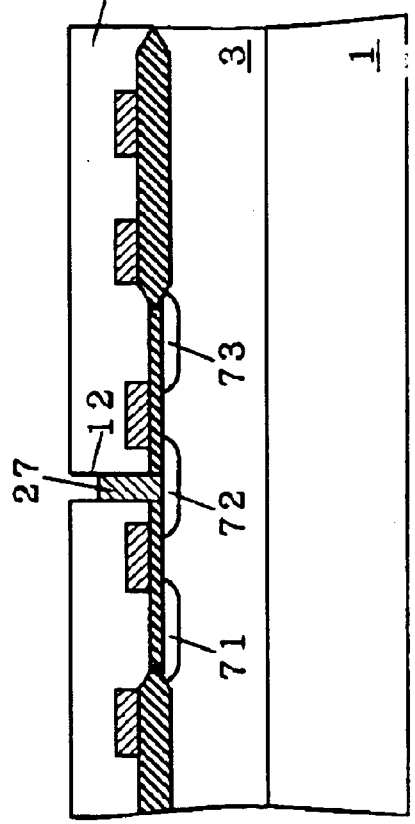

Next, as shown in FIGS. 5A and 5B, the interlayer insulating film 11 is etched back all over the surface under etching conditions in which the etching selectivity of the polysilicon plug 13 with respect to the interlayer insulating film 11 is 10, for example, to recess the polysilicon plug 13 to a given depth in the bit line contact hole 12, so as to form a recessed polysilicon plug 27 (recessed plug). The conditions for determining the etching selectivity and the recessed depth in this process step will be fully described later referring to FIGS. 12 to 14.

Next, in the process step shown in FIGS. 6A and 6B, bit line contact holes 14 (second contact holes) are formed by an anisotropic etching such as RIE (Reactive Ion Etching) through the interlayer insulating film 11 to reach the N$^+$-type source/drain regions 91 and 92 and the P$^+$-type source/drain regions 81 and 82 in the peripheral circuit part. Then a metal layer of TiN (titanium nitride) or W (tungsten), or a multi-layered film thereof, is formed all over the interlayer insulating film 11, and the metal layer (or the multi-layered metal film) is buried in the bit line contact holes 12 and 14 to form buried layers 16A and 16B (first and second buried layers). Then the metal layer (or the multi-layered metal film) is patterned by photolithography and etching to form metal bit lines 16 (the wiring layer). When a multi-layered metal film is buried in the bit line contact holes 12 and 14, only one kind of metal may be buried depending on the size of the contact holes. However, even in this case, it can be said that an wiring layer is buried substantially.

After the bit line contact holes 14 are formed and before the metal layer (or the multi-layered metal film) is buried, the native oxide film on the bottom of the bit line contact holes 14 is removed by wet etching using HF (hydrofluoric acid).

Although the metal bit lines 16 in the peripheral circuit part do not always function only as bit lines, they are so named because they are formed in the same process step as the bit lines in the memory cell part. Also, the bit line contact holes 14 are so named because they are connected to the metal bit lines 16, though they are not always connected to bit lines.

Although not shown in FIGS. 1B, 2B, 3B, 4B, 5B and 6B, a TG (Transfer Gate) wiring is formed in the peripheral circuit part in the same fabrication process as the word lines 61 (i.e., the gate electrodes 6), for example. Since the TG wiring is formed in almost the same layer as the gate electrodes 6, it may be electrically connected with the metal bit lines 16 by using the bit line contact holes 14.

That is to say, in the process step shown in FIG. 6B, a bit line contact hole (almost the same as the bit line contact holes 14) reaching the TG wiring through the interlayer insulating film 11 may be formed at the same time when forming the bit line contact holes 14, and then the buried layer 16B is formed also in the bit line contact hole reaching the TG wiring at the same time when the buried layers 16B are formed in the bit line contact holes 14.

Figure 7A:
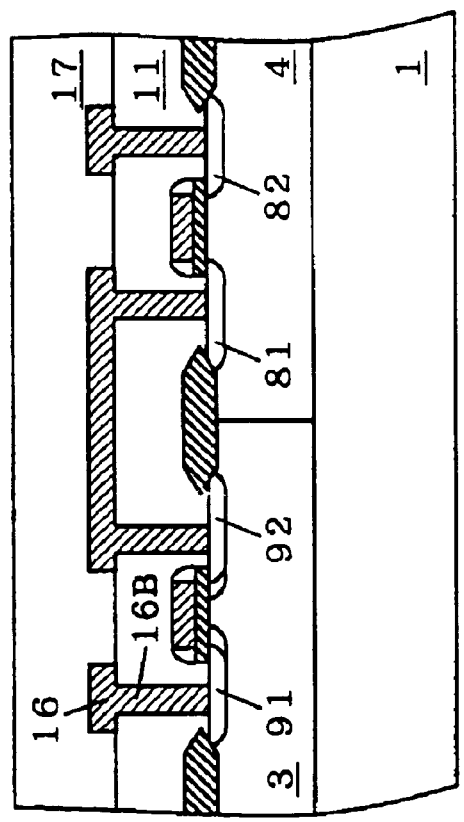
Figure 7B:
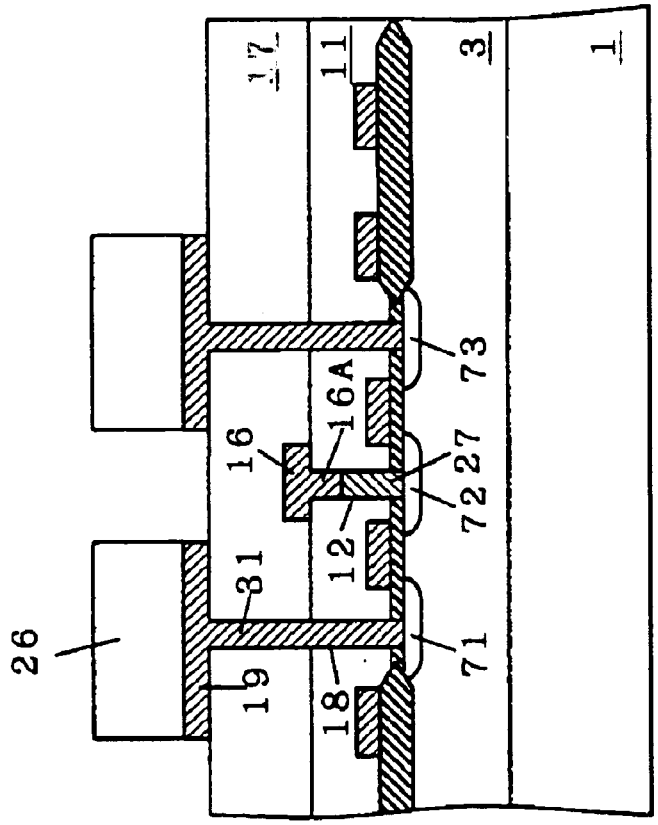

Next, in the process step shown in FIGS. 7A and 7B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the interlayer insulating film 17 with N⁺ polysilicon into which N-type impurities are introduced to a high concentration, for example, the conductor layer for the formation of storage nodes is also buried in the storage node contact holes 18 to form buried layers 31.

A thick insulating film is then formed all over the surface and then the conductor layer for the formation of storage nodes and the thick insulating film are removed through a process of photolithography and etching, leaving bottom films 19 forming the bottom of the storage nodes and the thick insulating film on the bottom films 19. Now the thick insulating film on the bottom films 19 is called insulating films 26 for the formation of cylindrical capacitors.

Figures 8A, 8B:
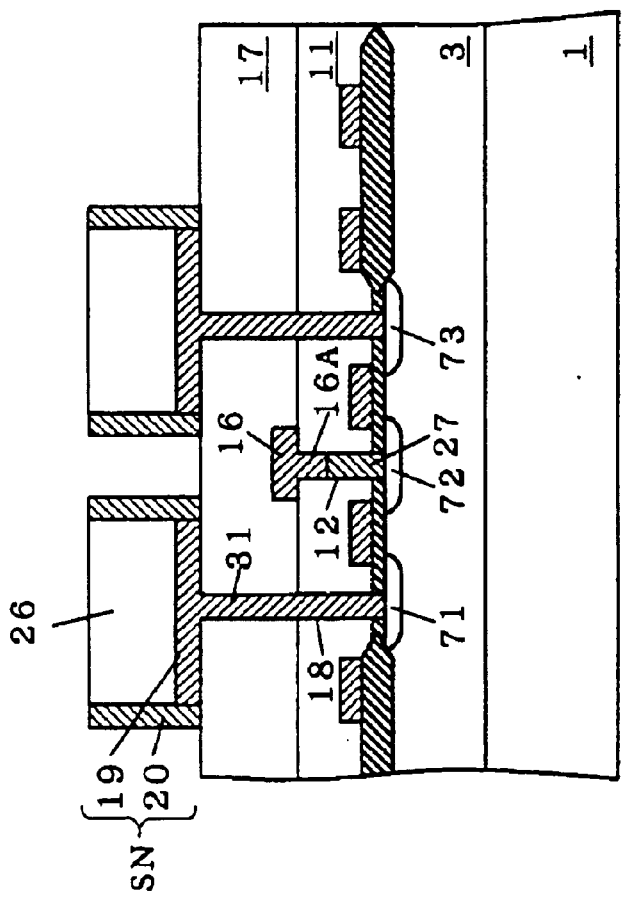

Next, in the process step shown in FIGS. 8A and 8B, a conductor layer for the formation of storage nodes is formed again all over the surface and is selectively removed by etch back, leaving the conductor layer for storage node formation only around the bottom films 19 and the insulating films 26 for cylindrical capacitor formation. The remaining parts of the conductor layer for storage node formation serve as side films 20 forming the side walls of the storage nodes. The bottom films 19 and the side films 20 form storage nodes SN.

Figure 9B:
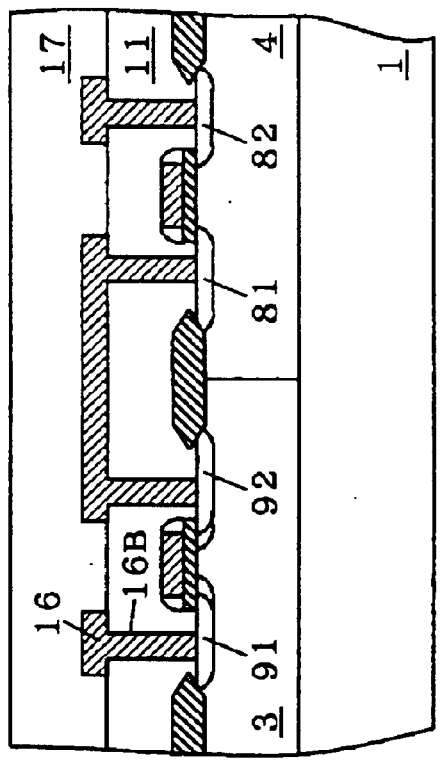
Figure 9A:
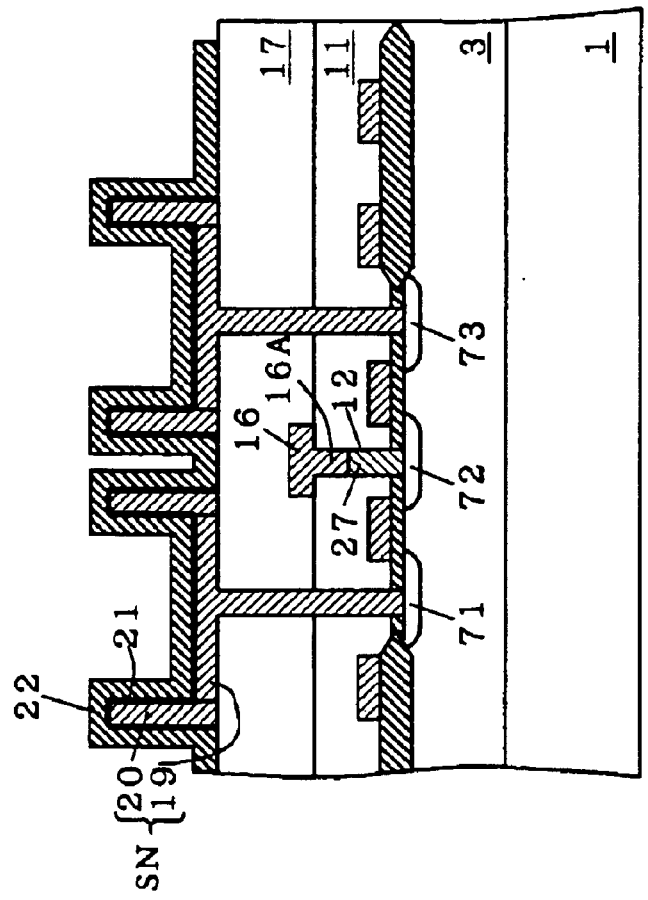
Figure 10B:
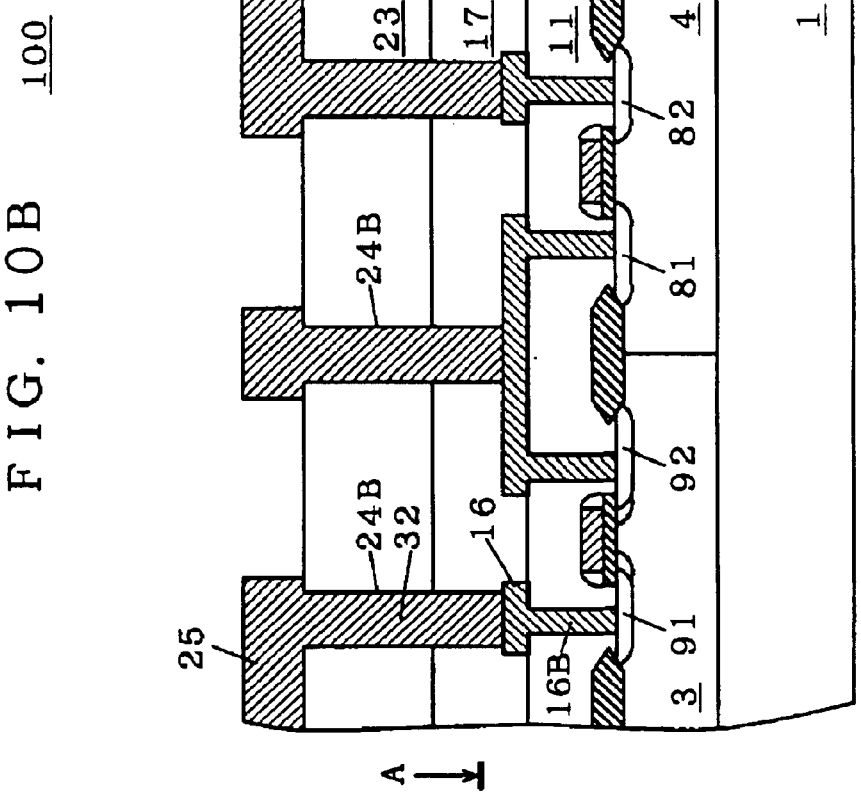
Figure 10A:
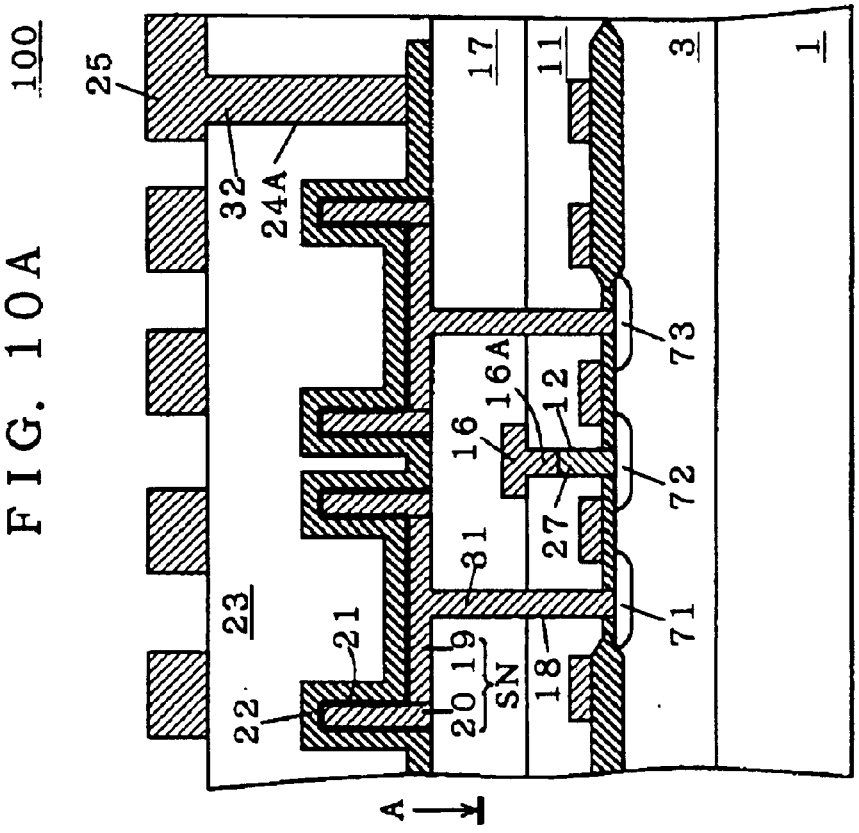

Next, only the insulating films 26 for cylindrical capacitor formation are removed and then a capacitor gate insulating film 21 is formed on the surface of the bottom films 19 and the side films 20 in the process step shown in FIGS. 9A and 9B. A conductive film for the formation of cell plate is then formed all over the surface and the conductive film for cell plate formation is left only in the memory cell part through a process of photolithography and etching. The remaining conductive film for cell plate formation forms a cell plate electrode 22.

Next, in the process step shown in FIGS. 10A and 10B, an oxide film is formed all over the surface and an interlayer insulating film 23 is formed by planarization. The interlayer insulating film 23 is called an interlayer insulating film underlying aluminum wiring so that it can be distinguished from other interlayer insulating films.

Next, an aluminum wiring contact hole 24A is formed to reach the cell plate electrode 22 in the memory cell part and aluminum wiring contact holes 24B are formed to reach the metal bit lines 16 through the interlayer insulating films 23 and 17 in the peripheral circuit part.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then through a process of photolithography and etching, an aluminum wiring 25 is formed on the interlayer insulating film 23 in the memory cell part and the peripheral circuit part to obtain a DRAM 100 having cylindrical capacitor cells.

Although not shown in FIGS. 6B, 7B, 8B, 9B and 10B, a BL (Bit Line) wiring is formed in the same fabrication process as the metal bit lines 16 in the peripheral circuit part, for example. Since it is formed in almost the same layer as the bit lines 16, the BL wiring and the aluminum wiring 25 may be electrically connected by using the aluminum wiring contact holes 24B.

Figure 11:
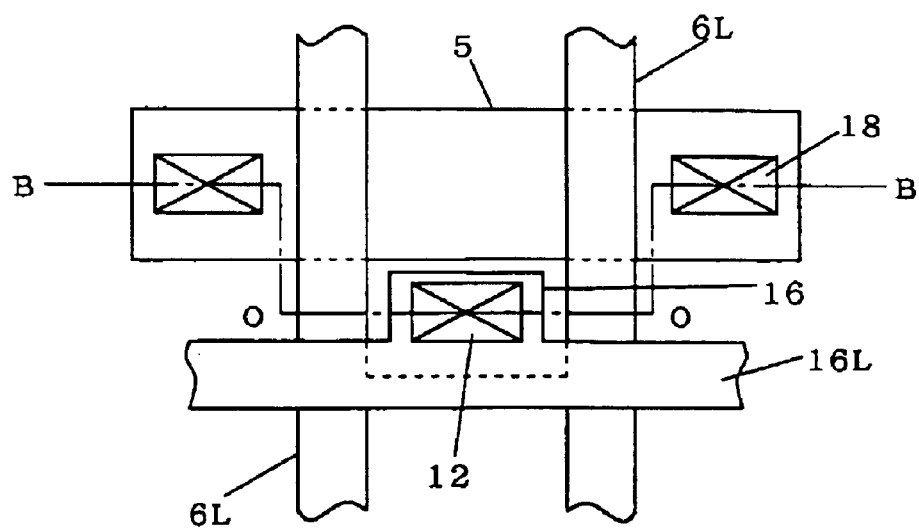
FIG. 11 is a partial plane view used to describe the structure according to the first preferred embodiment of the present invention.

Now FIG. 11 shows the plane view taken along the line AA in FIG. 10A. In FIG. 11, the invisible wiring, covered by the interlayer insulating film, is also shown by solid lines.

In FIG. 11, the metal bit line 16 is formed integrally with the BL wiring 16L to cover the bit line contact hole 12. The gate electrode 6 is formed integrally with the TG wiring 6L. The section taken along the line B00B in FIG. 11 shows the part below the line AA in FIG. 10A.

<A-2. Conditions for Formation of Recessed Polysilicon Plug>

Figure 12:
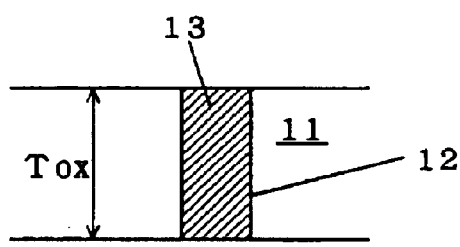
FIGS. 12 to 14 are diagrams used to describe conditions for the formation of a recessed polysilicon plug.
Figure 13:
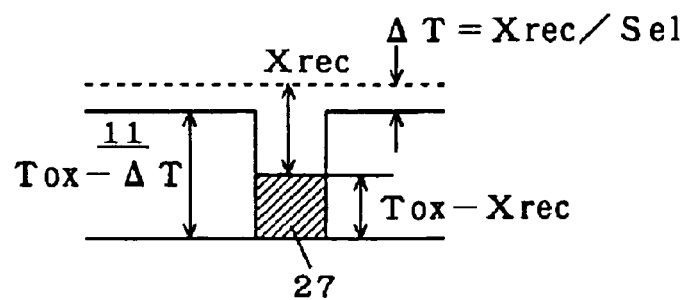
Figure 14:
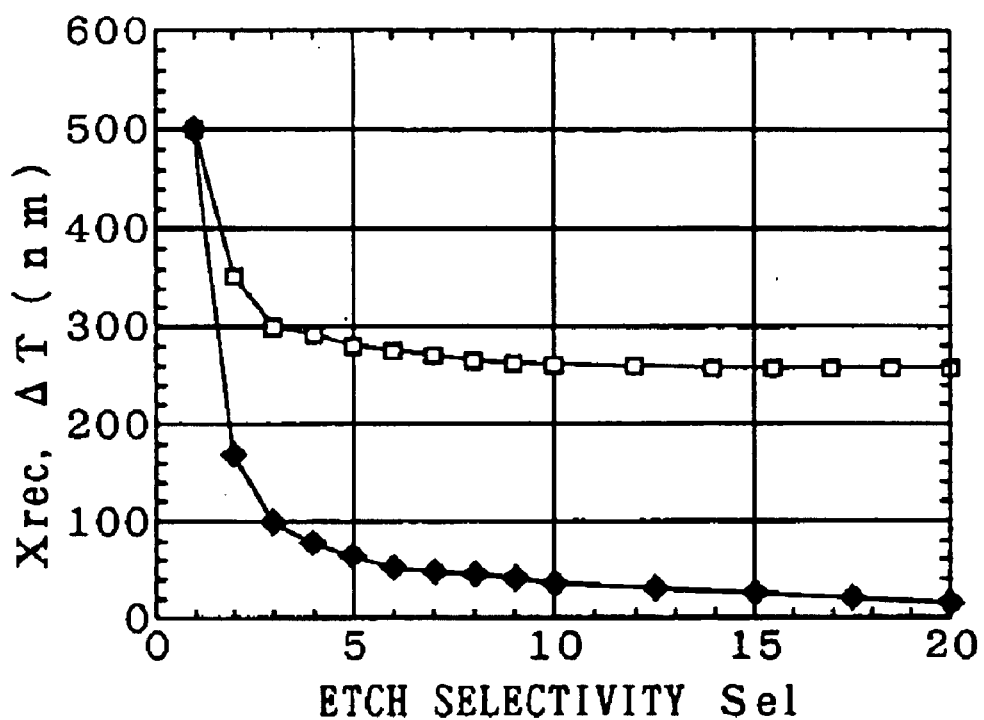

Now conditions for the formation of the recessed polysilicon plug 27 described referring to FIG. 5A will be further described referring to FIGS. 12 to 14.

FIG. 12 shows the interlayer insulating film 11 before the recessing process and the polysilicon plug 13 buried in the bit line contact hole 12 passing through the interlayer insulating film 11. As shown in FIG. 12, the thickness of the interlayer insulating film 11 before the recessing process is taken as Tox.

FIG. 13 shows the interlayer insulating film 11 after the recessing process and the recessed polysilicon plug 27 in the bit line contact hole 12. In FIG. 13, the surface level of the interlayer insulating film 11 before the recessing process is shown by the broken line.

As shown in FIG. 13, the reduction in thickness of the interlayer insulating film 11 etched in the recessing process is taken as ΔT, the thickness of the interlayer insulating film 11 after the recessing process is taken as Tox−ΔT, the recessed quantity of the polysilicon plug 13 is taken as Xrec, and the height of the recessed polysilicon plug 27 is taken as Tox−Xrec. When the etching selectivity of the polysilicon plug 13 with respect to the interlayer insulating film 11 is taken as Sel, the reduction ΔT in the thickness of the interlayer insulating film 11 is given as ΔT=Xrec/Sel.

Next, conditions for determining the etching selectivity and the recess depth will be described. In order to determine the etching selectivity and recess depth, it is necessary to consider the conditions for stably forming the recessed polysilicon plug 27 in the structural aspect (structural stability conditions) and the conditions for stably forming the recessed polysilicon plug 27 in the processing aspect (process stability conditions).

Specific indexes for the structural stability conditions include the value showing the position of the end surface of the recessed polysilicon plug 27 (the opposite side to the side in contact with the semiconductor silicon substrate) in the bit line contact hole 12 after the recessing process (which is called a "g-value"), for example. The g-value must be in the range of 1<g<1 to achieve structural stability of the recessed polysilicon plug 27. If the end surface of the recessed polysilicon plug 27 is at the midpoint in the bit line contact hole 12, then g=0.5.

The process stability conditions include the value obtained by comparing the etched quantity of the interlayer insulating film 11 between the case of the current selectivity Sel maintained and the case of the selectivity Sel increased by one (called an "f-value"), for example. The f-value must be in the range of 0<f<1 to achieve the processing stability. Now, f=0.1 means that the etched quantity of the interlayer insulating film 11 increases only 10% when the selectivity Sel is increased by one from the current selectivity Sel.

Next, the structural stability conditions can be numerically expressed with the quantities shown in FIGS. 12 and 13, the g-value, and the f-value as shown in the following equations (1) to (3), and the process stability conditions can be given as the following expression (4). For the selectivity Sel, Sel>1.

$$(Tox-Xrec)=g(Tox-Xrec/Sel)>0 \quad (1)$$

$$Xrec=(1-g)Tox/\{1-(g/Sel)\} \quad (2)$$

$$\Delta T=Xrec/Sel \quad (3)$$

$$Sel>(1+f\cdot g)/f \quad (4)$$

FIG. 14 shows a graph created on the basis of the equations (2) and (3). In FIG. 14, with the thickness of the interlayer insulating film 11 being 500 mm and g=0.5, the quantity of plug recess Xrec and the reduction ΔT in the thickness of the interlayer insulating film 11 are plotted with respect to the etching selectivity Sel changed from 1 to 20.

The etching selectivity Sel satisfying the process stability conditions is obtained from expression (4) as Sel=10.5 (in the case where f=0.1, g=0.5). The quantity of plug recess Xrec and the reduction ΔT in the thickness of the interlayer insulating film 11 in the case of Sel=10.5 are obtained from the graph in FIG. 14 as Xrec=263 nm, ΔT=25 nm, and the final height of the recessed polysilicon plug 27 is about 238 nm.

It is seen from FIG. 14 that the selectivity dependencies of the quantity of plug recess Xrec and the reduction ΔT in the thickness of the interlayer insulating film 11 are both stable with the selectively at or above 5. Then it is seen that the selectivity should be set around 10 to process-stably form the stable structure in which the end surface of the recessed polysilicon plug 27 is located at the midpoint in the bit line contact hole 12. It can be said that the recessed polysilicon plug 27 is not too thick nor too thin and the structural stability conditions are satisfied when the g-value is 0.5.

Further, it is seen that when the g-value is in the range of 0<g<1, that is, whatever value the recessed quantity of the polysilicon plug 13 may be, setting the selectivity around 10 enables stable formation of the recessed polysilicon plug 27 in both of structural and processing aspects.

<A-3. Characteristic Functions and Effects>

As has been described above, according to the first preferred embodiment of the present invention, the interlayer insulating film 11 is etched back all over the surface to recess the polysilicon plug 13 to a given depth in the bit line contact hole 12 to form the recessed polysilicon plug 27, as described referring to FIG. 5A. As has been described referring to FIG. 6B, after forming the bit line contact holes 14 and before burying the metal layer (or the multi-layered metal film), the native oxide film on the bottom of the bit line contact holes 14 is removed by wet etching using HF or the like. At this time, even if the interlayer insulating film 11 is also removed, the recessed polysilicon plug 27 will not protrude. Hence, even if the bit line resist pattern is misaligned in the formation of the metal bit lines 16, the material of the metal bit lines 16 will not be left as a residue like a side wall on the edge of a protruding plug, which prevents the problem that the residue comes off to cause particles.

Further, forming the metal bit lines 16 at the same time when burying the metal layer (or the multi-layered metal film) in the bit line contact holes 14 eliminates the necessity of the CMP process which has been required in the conventional manufacturing method in which the metal plugs are buried in the bit line contact holes 14 in a different process step from the formation of the metal bit lines 16. This solves the problem that the CMP forms a step exceeding the step height allowed in the planarization process between the memory cell part and the peripheral circuit part. This in turn prevents the problem that the difference in level between the two exceeds the focus margin in the bit line formation by photolithography and hinders the formation of the bit lines.

Structurally, in the memory cell part which is designed under strict conditions in the aspect of layout, the buried layer 16A made of almost the same material as the metal bit lines 16 is connected to the recessed polysilicon plug 27 having its end face recessed in the bit line contact hole 12. In this case, while the recessed polysilicon plug 27 and the silicon semiconductor substrate having close physical properties suppress applications of stresses to the silicon semiconductor substrate and the structure around the recessed polysilicon plug 27 even if the recessed polysilicon plug 27 is thermally expanded, the metal buried layer 16A reduces electric resistance between the metal bit line 16 and the silicon semiconductor substrate.

<A-4 Modifications>

While a DRAM having a memory cell part and a peripheral circuit part has been described above as an example of a semiconductor device and manufacturing method in which a recessed polysilicon plug having a height lower than the depth of a bit line contact hole is buried in the bit line contact hole in the memory cell part, applications of the present invention are not limited thereto. The present invention can be applied to any semiconductor devices having a plurality of circuit parts with different structures and in which layers (semiconductor layer, conductor layer) provided above and below an interlayer insulating film are electrically connected through a plug buried in the interlayer insulating film in the circuit parts.

<B. Second Preferred Embodiment>

The first preferred embodiment of the present invention has described a semiconductor device and a manufacturing method in which the polysilicon plug is recessed to form a recessed polysilicon plug in the memory cell part, and the bit line contact hole in which the recessed polysilicon plug is buried and bit line contact holes in the peripheral circuit part are filled with a material for the formation of bit lines at the same time as the formation of the bit lines. Actually, as semiconductor devices are miniaturized, the overlay accuracy in photolithography is not improved in step with the miniaturization. Accordingly, the miniaturization of semiconductor devices encounters the problem that when a bit line is misaligned on a bit line contact hole, for example, the contact area between the bit line and the bit line contact hole may become smaller than the opening area of the contact hole. Further, the contact areas may vary largely. As a result, the contact resistance between the bit line and the bit line contact hole increases and the contact resistance varies largely. This tendency is especially considerable in the memory cell part which is laid out with minimum design rules. For the peripheral circuit part in which application of the minimum design rules may cause processing troubles like difficulty in photolithography, layout is achieved with more relaxed design rules than the minimum design rules. This somewhat reduces the above-mentioned tendency.

<B-1. Manufacturing Process>

Figure 15A:
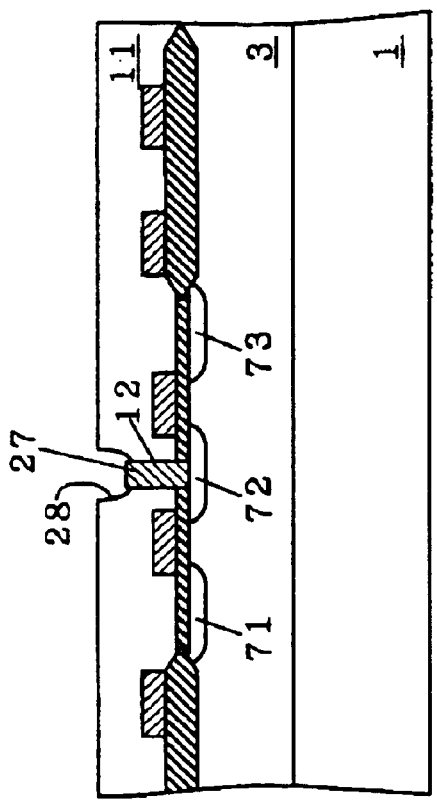
Figure 15B:
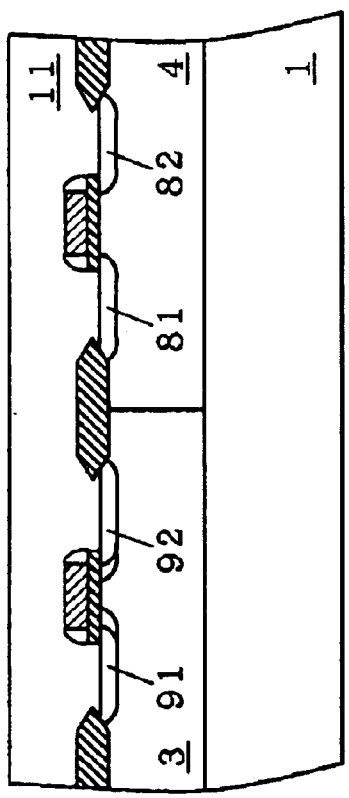

As a second preferred embodiment of the present invention, a structure and manufacturing method of a DRAM 200 having cylindrical capacitor cells will be described referring to FIGS. 15A to 20B. Process steps performed before obtaining the structure shown in FIGS. 15A and 15B are the same as those in the manufacturing method for the DRAM 100 described referring to FIGS. 1A to 5B in the first preferred embodiment. They are therefore not described again. The structure of the DRAM 200 is shown in FIGS. 20A and 20B showing the final process step.

FIGS. 15A, 16A, 17A, 18A, 19A and 20A are partial sectional views showing the memory cell part (data holding part) of the DRAM 200, and FIGS. 15B, 16B, 17B, 18B, 19B and 20B are partial sectional views showing the peripheral circuit part including sense amps, decoders, etc., formed around the memory cell part in the DRAM 200.

As has been described referring to FIGS. 5A and 5B, the interlayer insulating film 11 is etched back all over the surface under the etching conditions in which the etching selectivity for the polysilicon plug 13 with respect to the interlayer insulating film 11 is 10, for example, and the polysilicon plug 13 is thus recessed to a given depth in the bit line contact hole 12 to form a recessed polysilicon plug 27. Subsequently, as shown in FIGS. 15A and 15B, the interlayer insulating film 11 is wet-etched to enlarge the opening diameter of the bit line contact hole 12 to a given size to form an enlarged contact part 28. The depth of the enlarged contact part 28 is such that it reaches the recessed polysilicon plug 27, and its contour in section is a curved shape. The conditions for determining the opening diameter of the enlarged contact part 28 will be fully described later referring to FIGS. 21 and 22.

Figure 16B:
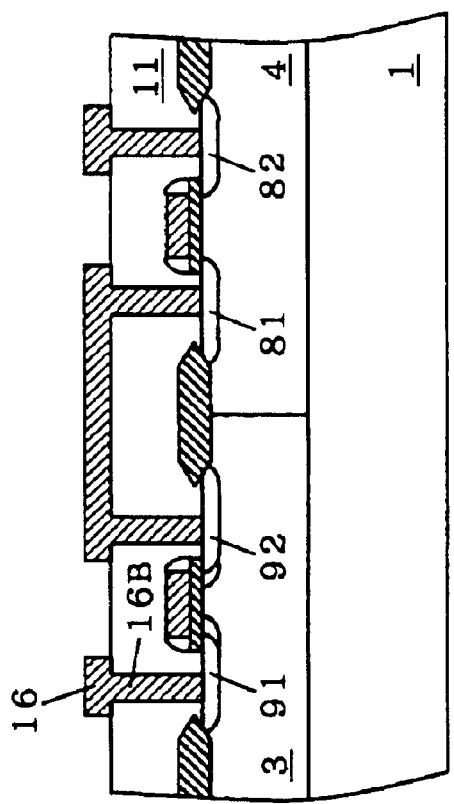
Figure 16A:
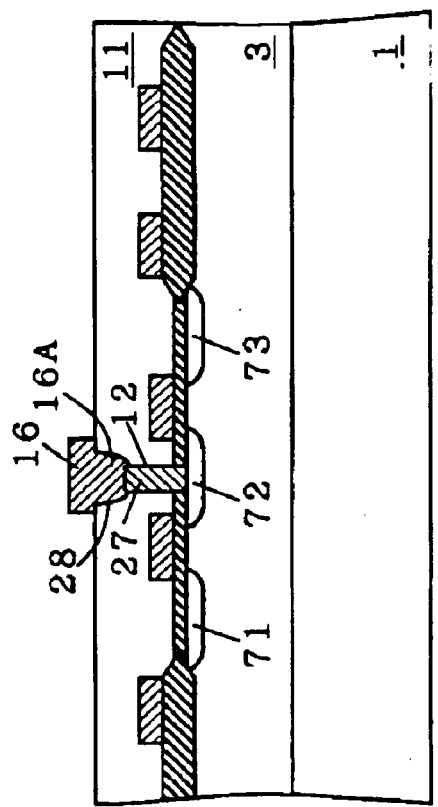

Next, in the process step shown in FIGS. 16A and 16B, bit line contact holes 14 passing through the interlayer insulating film 11 are formed by an anisotropic etching as RIE to reach the N$^+$-type source/drain regions 91 and 92 and the P$^+$-type source/drain regions 81 and 82 in the peripheral circuit part. Then a metal layer of TiN, W, or the like, or a multi-layered film thereof, is formed all over the interlayer insulating film 11, and the metal layer (or the multi-layered metal film) is buried in the bit line contact holes 14 and in the enlarged contact part 28 to form a buried layer 16A. Then the metal layer (or the multi-layered metal film) is patterned by photolithography and etching to form the metal bit lines 16. When a multi-layered metal film is buried in the bit line contact holes 14 and the enlarged contact part 28, one kind of metal only may be buried, depending on the size of the contact hole or the contact part. However, even in this case, it can be said that an wiring layer is buried substantially.

After forming the bit line contact holes 14 and before burying the metal layer (or the multi-layered metal film) to form the buried layers 16B, the native oxide film on the bottom of the bit line contact holes 14 is removed by wet etching using HF or the like.

Although the metal bit lines 16 in the peripheral circuit part do not always function only as bit lines, they are so named because they are formed in the same process as the bit lines in the memory cell part. Also, the bit line contact holes 14 are so named because they are connected to the metal bit lines 16, though they are not always connected to bit lines.

Figure 17B:
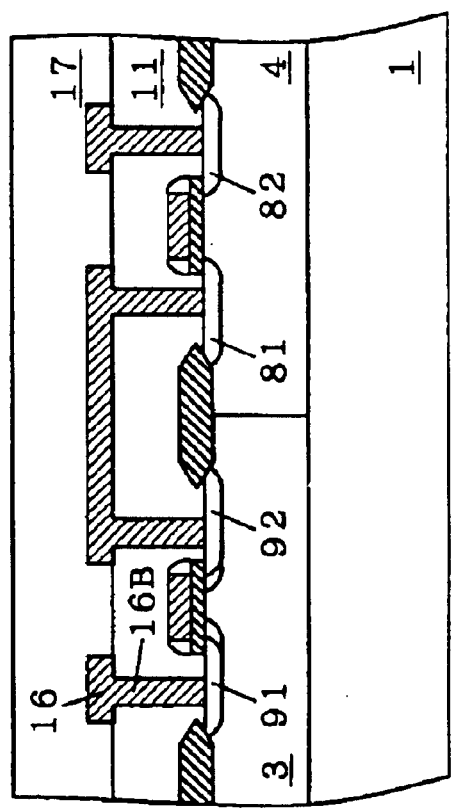
Figure 17A:
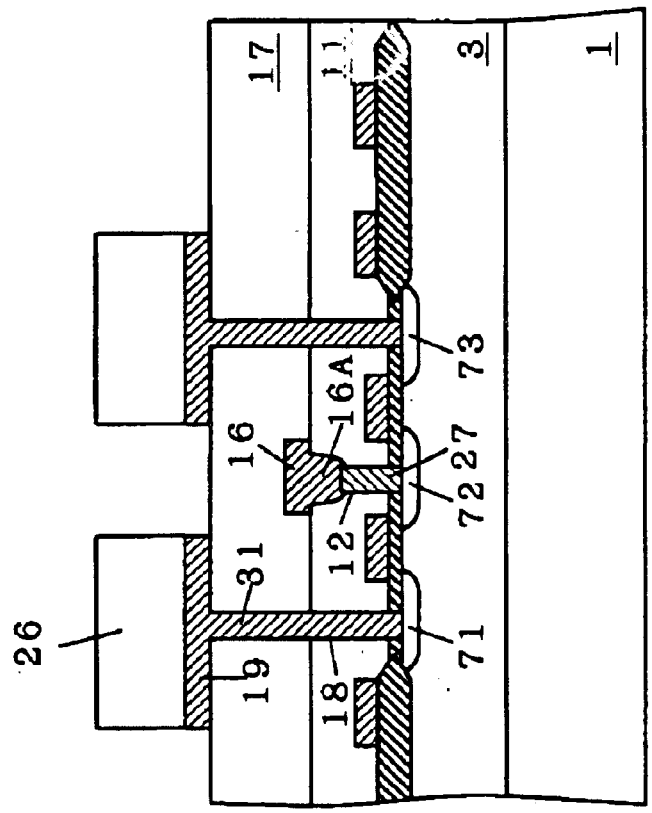

Next, in the process step shown in FIGS. 17A and 17B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the surface of the interlayer insulating film 17 with N$^+$ polysilicon into which N-type impurities are introduced at a high concentration, for example, the conductor layer for the formation of storage nodes is also buried in the storage node contact holes 18 to form buried layers 31.

Then a thick insulating film is formed all over the surface and then the conductor layer for the formation of storage nodes and the thick insulating film are removed through a process of photolithography and etching, leaving the bottom films 19 forming the bottom of the storage nodes and the thick insulating film on the bottom films 19. Now the thick insulating film on the bottom films 19 is called insulating films 26 for the formation of cylindrical capacitors.

Next, in the process step shown in FIGS. 18A and 18B, a conductor layer for the formation of storage nodes is formed again all over the surface and is selectively removed by etch back, and it is left only around the bottom films 19 and the insulating films for the formation of cylindrical capacitors, 26. The remaining parts of the conductor layer for the formation of storage nodes form side films 20 forming the side walls of the storage nodes. The bottom films 19 and the side films 20 form storage nodes SN.

Next, only the insulating films 26 for cylindrical capacitor formation are removed and then a capacitor gate insulating film 21 is formed on the surface of the bottom films 19 and the side films 20 in the process step shown in FIGS. 19A and 19B. Then a conductive film for the formation of cell plate is formed all over the surface and is left only in the memory cell part through process of photolithography and etching. The remaining conductive film for cell plate formation forms a cell plate electrode 22.

Next, in the process step shown in FIGS. 20A and 20B, an oxide film is formed all over the surface and planarized to form an interlayer insulating film 23. The interlayer insulating film 23 is called an interlayer insulating film underlying aluminum wiring to distinguish it from other interlayer insulating films.

Next, an aluminum wiring contact hole 24A reaching the cell plate electrode 22 is formed in the memory cell part and aluminum wiring contact holes 24B are formed to reach the metal bit lines 16 through the interlayer insulating films 23 and 17 in the peripheral circuit part.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then, through a process of photolithography and etching, aluminum wiring 25 is formed on the interlayer insulating film 23 in the memory cell part and the peripheral part to obtain a DRAM 200 having cylindrical capacitor cells.

<B-2. Conditions for Determining Opening Diameter of Enlarged Contact Part>

Now the conditions for the formation of enlarged contact part 28 described referring to FIG. 15A will be described in greater detail referring to FIGS. 21 and 22.

Figure 21:
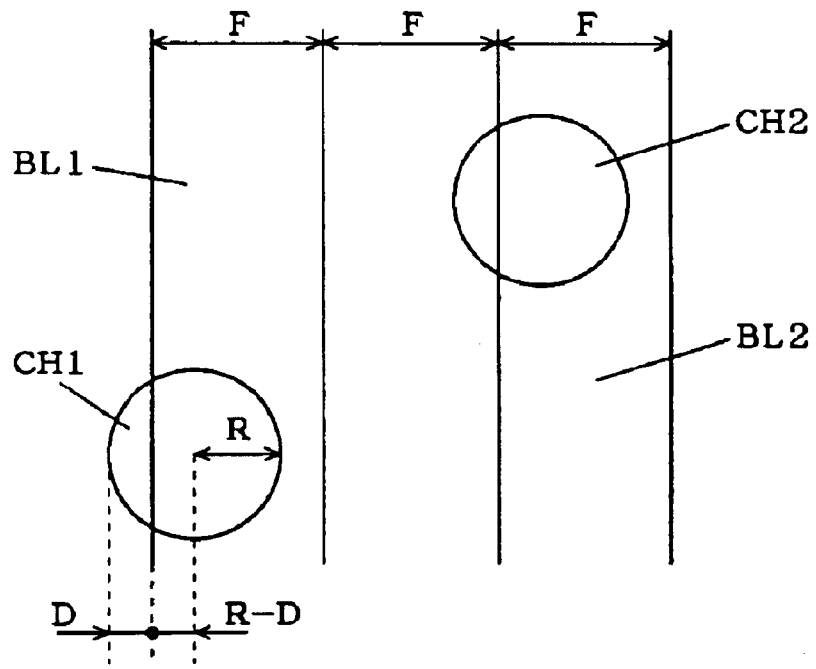
FIGS. 21 and 22 are diagrams used to describe conditions for determining the opening diameter of an enlarged contact part.

FIG. 21 is a diagram schematically showing the bit lines and bit line contact holes misaligned in the memory cell part which is laid out with minimum design rules. This diagram shows parallel two bit lines BL1 and BL2 formed on bit line contact holes CH1 and CH2.

As shown in FIG. 21, the bit lines BL1 and BL2 both have a width of F, and the interval between the two is also F. The radius of both bit line contact holes CH1 and CH2 is R, and their diameter 2R is equal to the line width F of the bit lines BL1 and BL2. In FIG. 21, the bit lines BL1 and BL2 are shifted from the bit line contact holes CH1 and CH2 by a length D. Accordingly, the contact areas between the bit lines BL1 and BL2 and the bit line contact holes CH1 and CH2 decrease and the contact resistance increases accordingly. In order to compensate for the increase in contact resistance, the opening radius of the bit line contact holes CH1 and CH2 is increased by $\Delta R$ to form enlarged contact parts CH10 and CH20, and the bit lines BL1 and BL2 are formed thereon. This structure is shown in FIG. 22.

Figure 22:
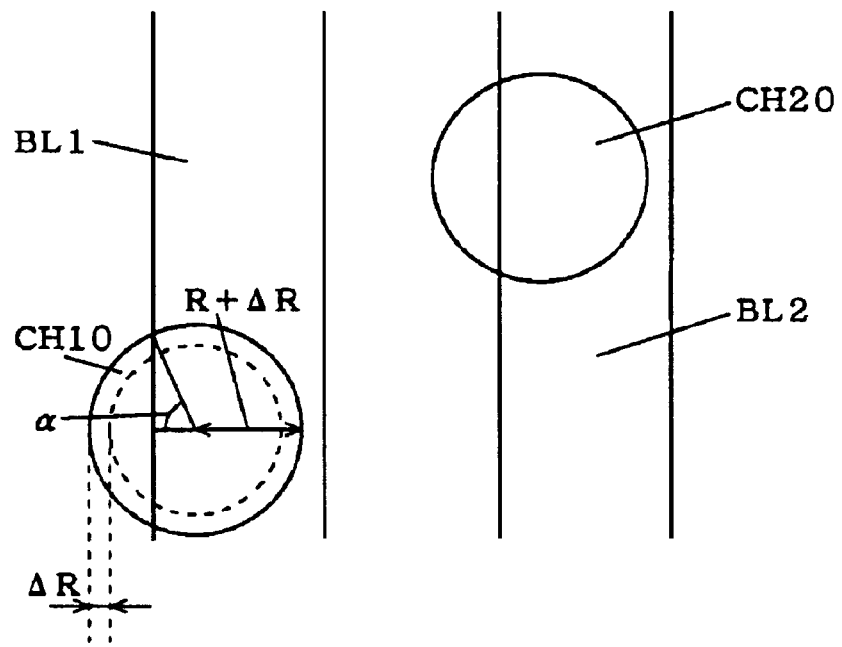
Figure 23B:
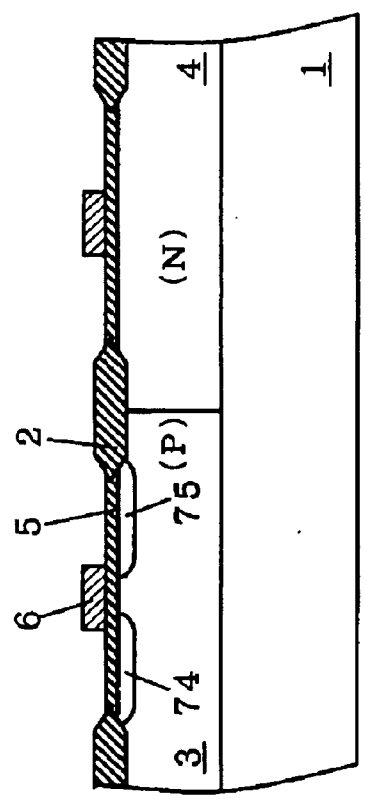
Figure 23A:
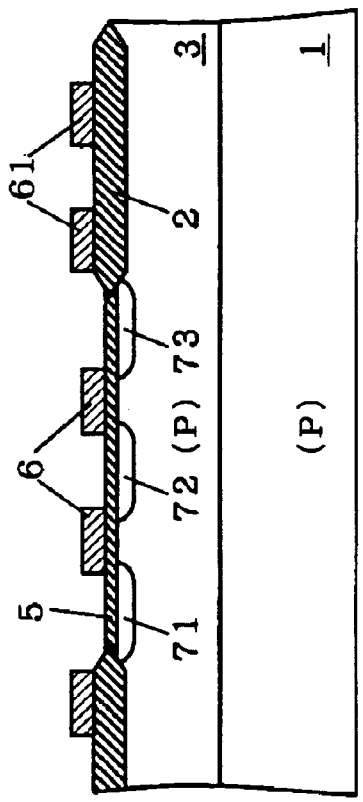
Figure 24B:
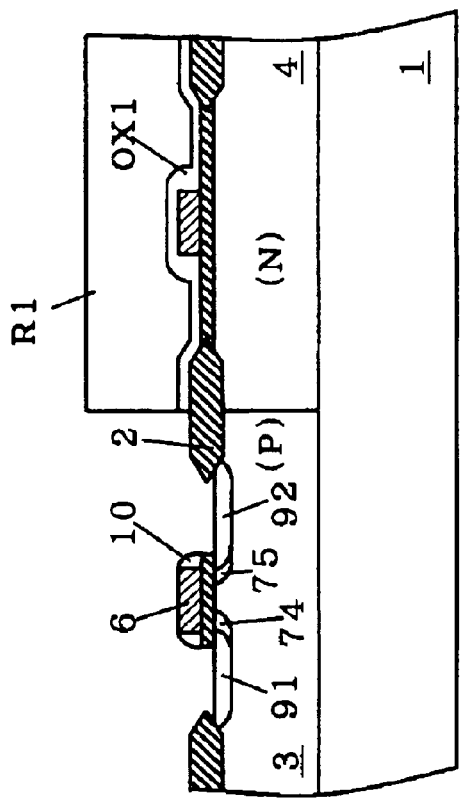
Figure 24A:
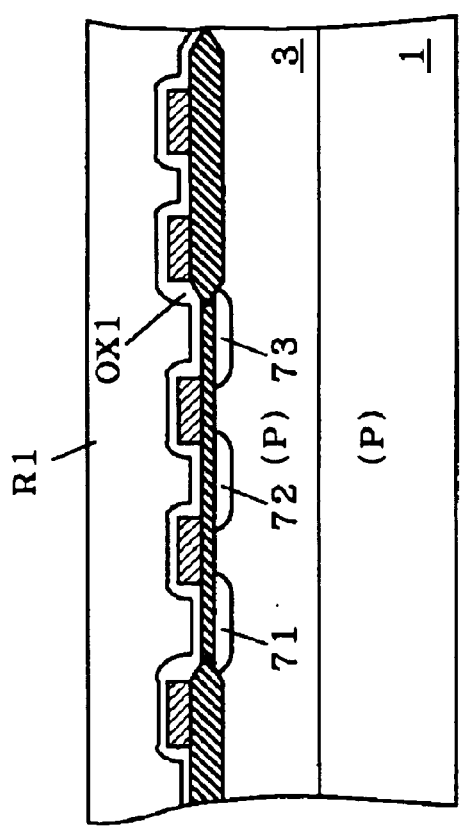
Figure 25B:
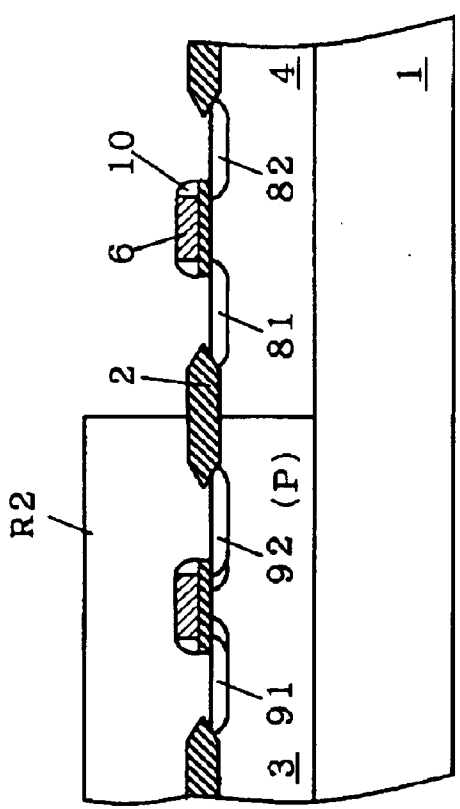
Figure 25A:
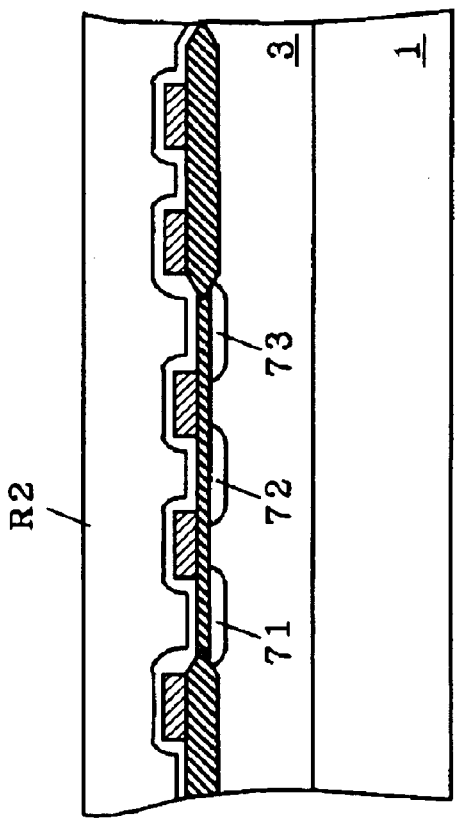
Figure 26A:
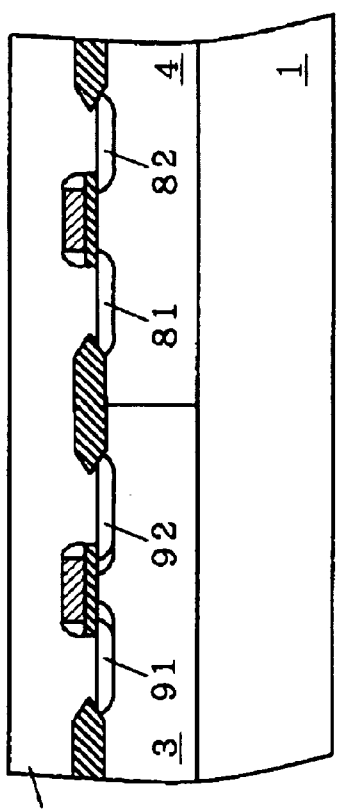
Figure 26B:
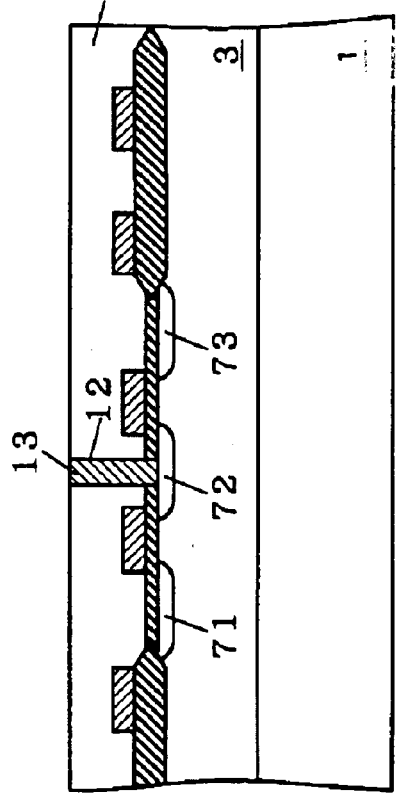
Figures 27A, 27B:
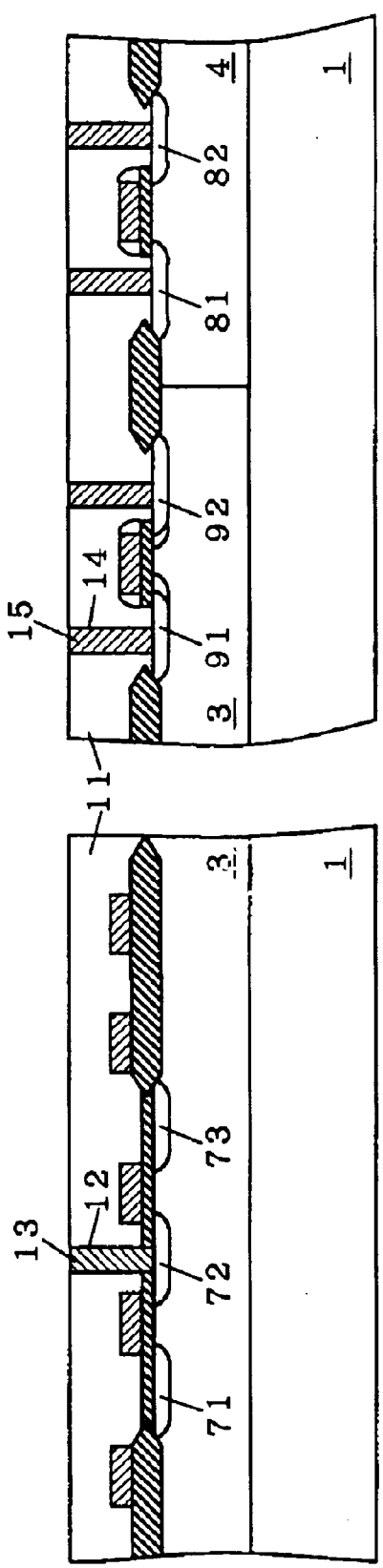
Figure 29A:
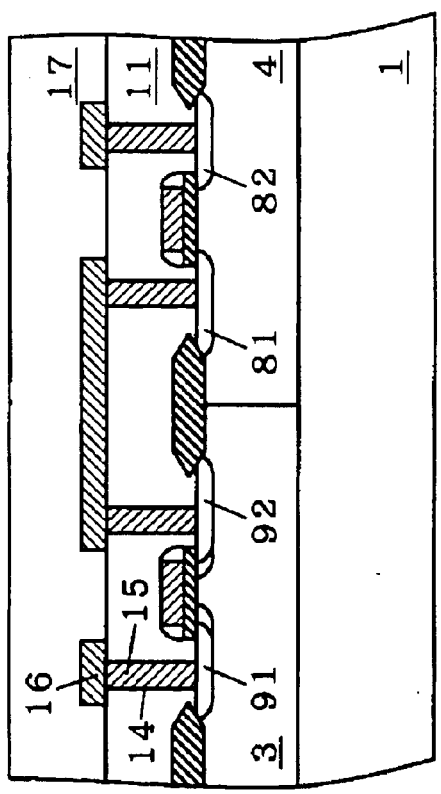
Figure 29B:
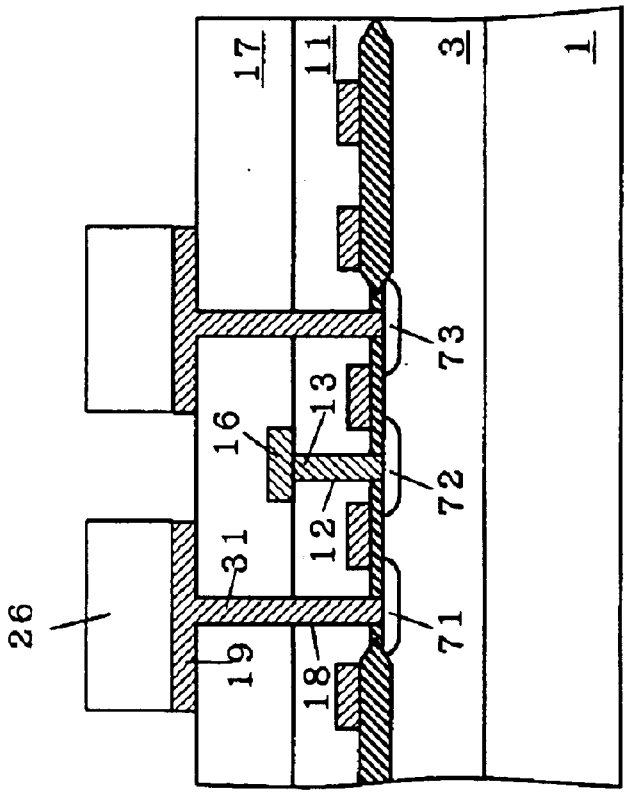
Figure 30A:
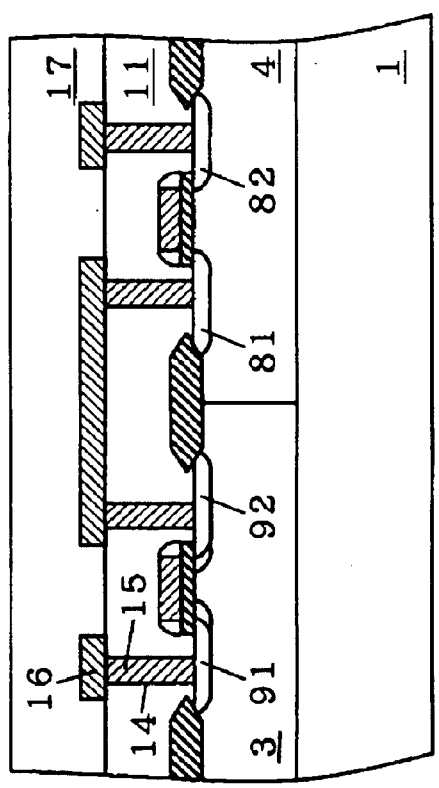
Figure 30B:
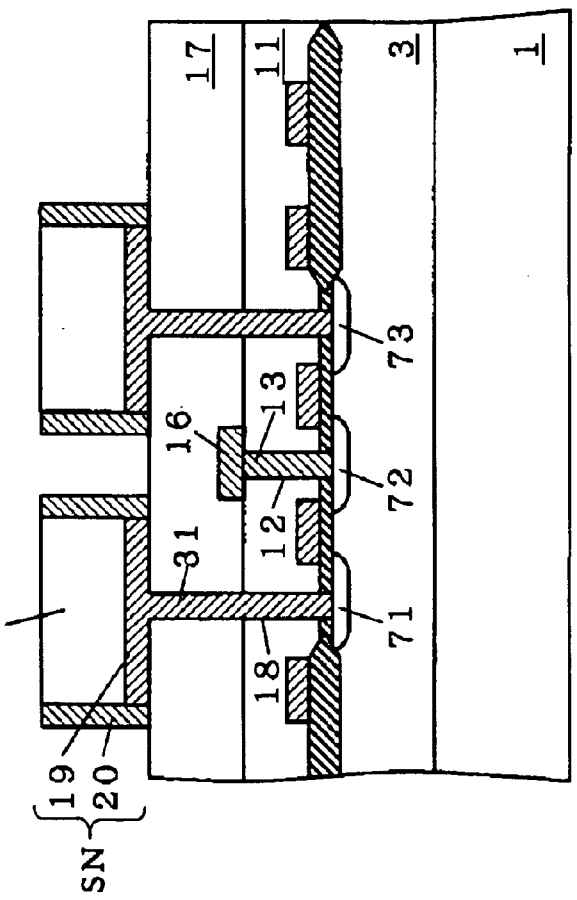
Figure 31B:
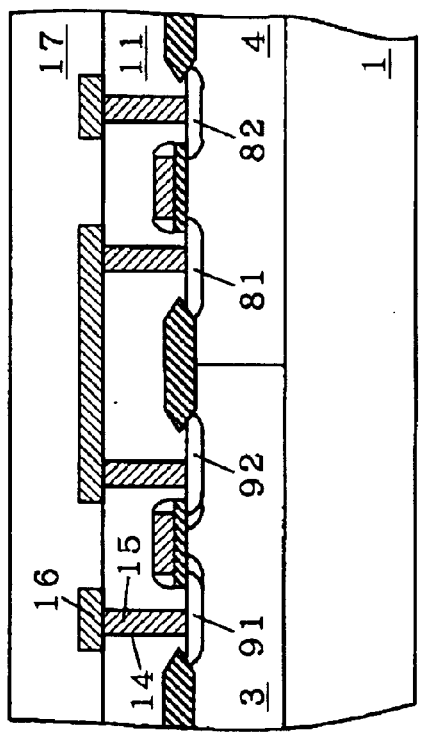
Figure 31A:
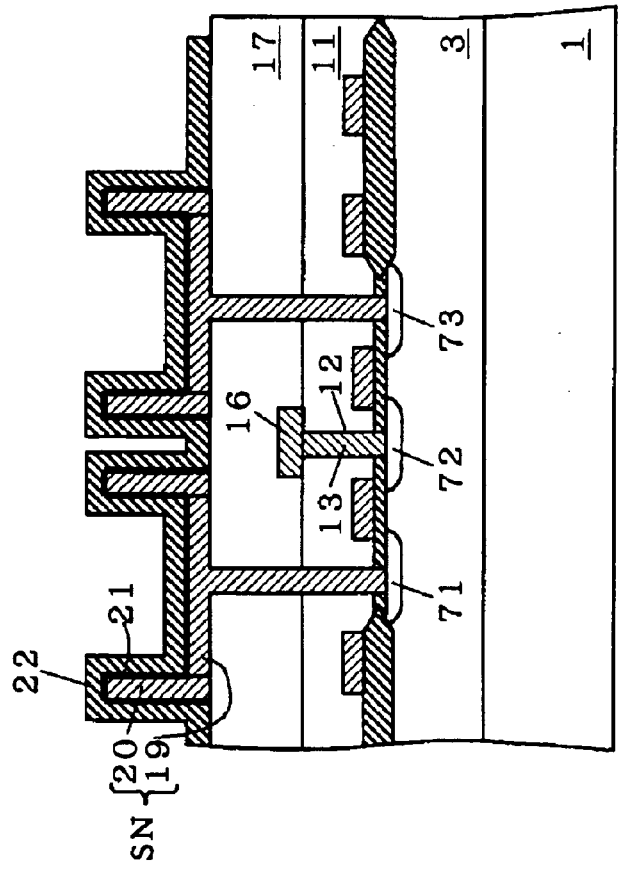
Figure 32A:
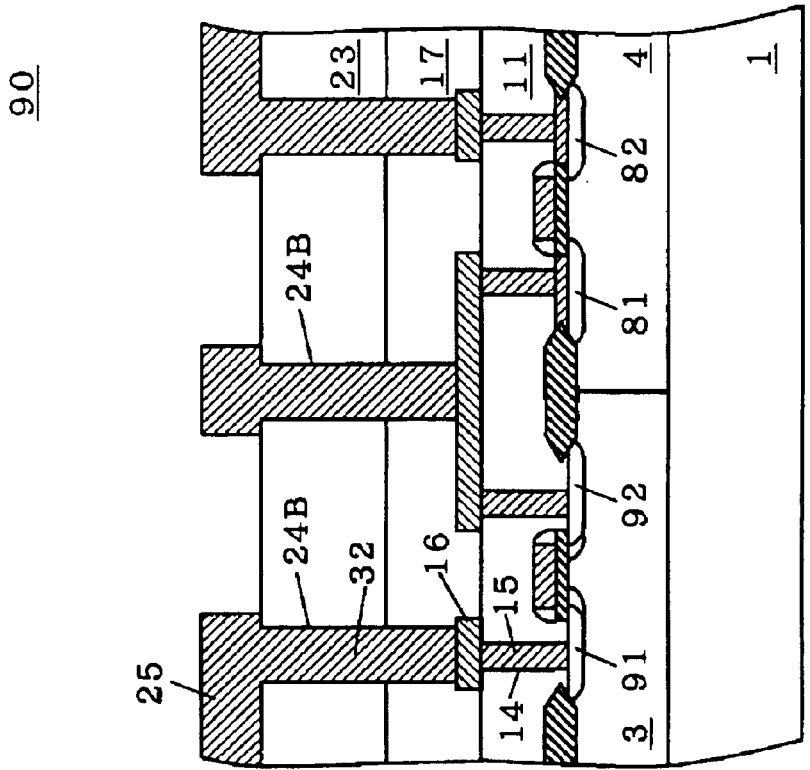
Figure 32B:
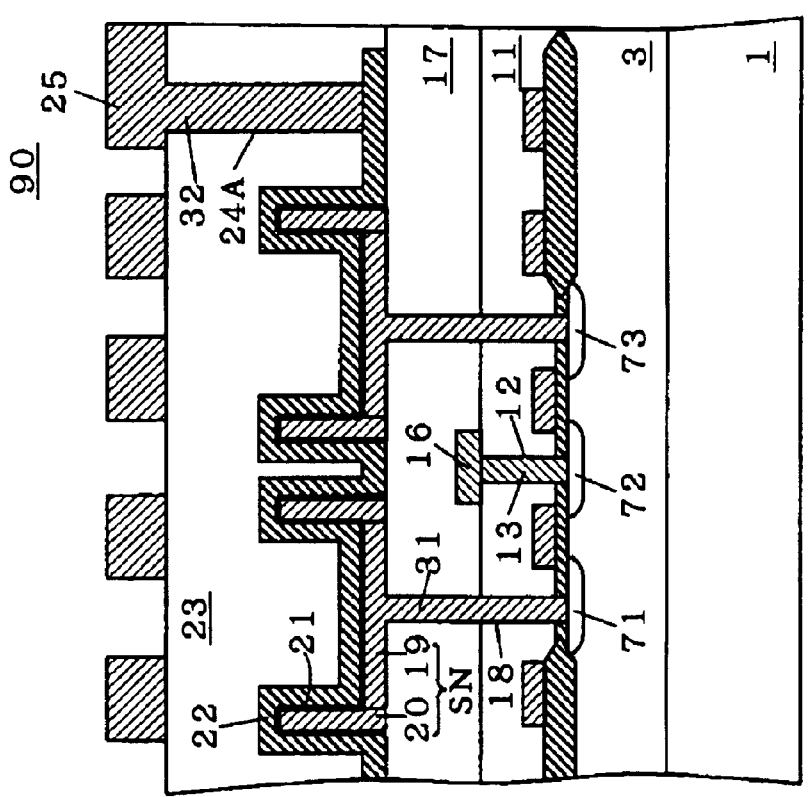
Figure 33:
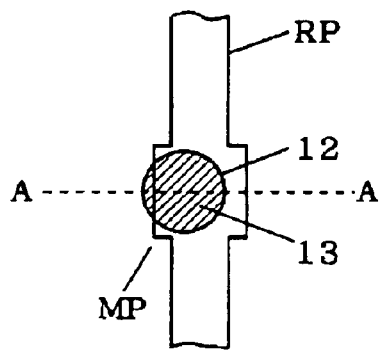
FIGS. 33 to 35 are diagrams used to describe a problem of the conventional semiconductor device.
Figure 34:
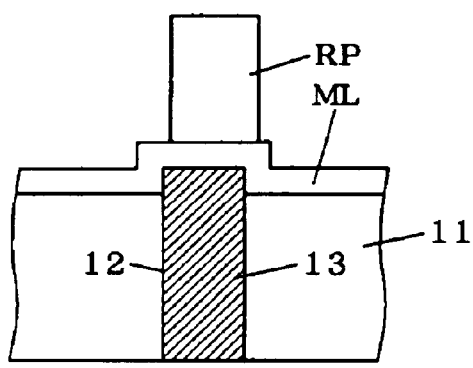
Figure 35:
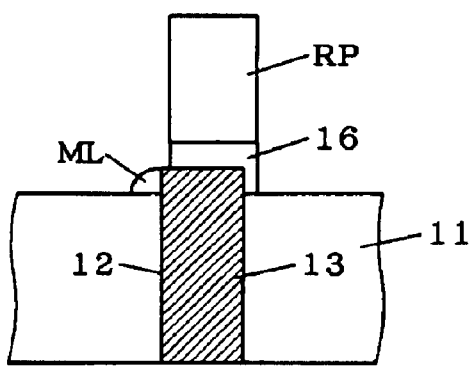

As shown in FIG. 22, the radiuses of the enlarged bit line contact holes CH10 and CH20 are both $R+\Delta R$. Further, in the right triangle whose hypotenuse corresponds to the line connecting the center of the enlarged bit line contact hole CH10 and the intersection of the edge of the bit line BL1 and the circumference of the enlarged bit line contact hole CH10, the angle on the center side is taken as $\alpha$. In FIG. 22, the bit line contact hole CH1 is shown by the broken line.

The conditions for determining the opening diameter of the enlarged contact part includes that the area of the overlap between the enlarged bit line contact hole and the bit line shown in FIG. 22 should be larger than the area of the bit line contact hole before enlarged, which is numerically expressed as the following expressions (5) and (6) by using the quantities shown in FIGS. 21 and 22.

$$1/2(2\pi-2\alpha+\sin 2\alpha)(F/2+\Delta R)^2 > \pi(F/2)^2 \tag{5}$$

$$\cos \alpha = (F/2-D)/(F/2+\Delta R) \tag{6}$$

In the expressions (5) and (6), the radius R of the bit line contact hole is set to be a half of the line width F of the bit line. It is necessary for the expression (6) that $D<F/2$.

When the increase $\Delta R$ in the opening radius is set to satisfy the expressions (5) and (6), the increase in the contact resistance can be suppressed even if the bit line is shifted from the bit line contact hole.

The enlargement of the opening radius of the bit line contact holes must be suppressed to such an extent that they will not short with adjacent bit line contact holes. Such conditions are given by using the quantities shown in FIGS. 21 and 22 as $D+\Delta R<F$.

<B-3. Characteristic Functions and Effects>

According to the second preferred embodiment of the present invention, as has been described referring to FIG. 15A, the interlayer insulating film 11 is wet-etched after the formation of the recessed polysilicon plug 27 and the opening diameter of the bit line contact hole 12 is thus enlarged to form the enlarged contact part 28, and the enlarged contact part 28 is filled with the material for bit line formation when forming the metal bit lines 16. Accordingly, it is possible to suppress the increase in contact resistance even if the metal bit line 16 is misaligned when overlaid.

While the invention has been described in detail, the foregoing description is in all aspects illustrative and not restrictive. It is understood that numerous other modifications and variations can be devised without departing from the scope of the invention.

I claim:

1. A semiconductor device comprising first and second circuit parts with different structures formed on a semiconductor substrate,
    wherein said first circuit part comprises;
        a first contact hole formed through a first part of an interlayer insulating film formed in said semiconductor substrate,
        a recessed plug of a conductor having its one end electrically connected to said semiconductor substrate and its other end located in a recessed position in said first contact hole, a g-value showing a position of an end of the recessed plug is approximately 0.5 and
        a first wiring layer being electrically connected with said recessed plug and extending from a position inside said first contact hole over the first part of said interlayer insulating film, and
    said second circuit part comprises;
        a second contact hole formed through a second part of said interlayer insulating film formed on said semiconductor substrate, and
        a second wiring layer being electrically connected with said semiconductor substrate and extending from a position inside said second contact hole over the second part of said interlayer insulating film.

2. The semiconductor device according to claim 1,
    wherein said recessed plug is composed of polysilicon as a material, and
    said first and second wiring layers are composed of metal as a material.

3. The semiconductor device according to claim 2,
    wherein said first circuit part is a data holding part for holding data by accumulating charge in a capacitor, and
    said second circuit part is a peripheral circuit part configured to function in relation to said data holding part.

4. The semiconductor device according to claim 1, wherein said first contact hole has an enlarged contact part in a part from a main surface of said interlayer insulating film to the other end of said recessed plug, said enlarged contact part having a diameter larger than an opening diameter of the part in which said recessed plus is buried.

5. The semiconductor device according to claim 4, wherein said recessed plug is composed of polysilicon as a material, and said first and second wiring layers are composed of metal as a material.

6. The semiconductor device according to claim 5, wherein said first circuit part is a data holding part for holding data by accumulating charge in a capacitor, and said second circuit part is a peripheral circuit part configured to function in relation to said data holding part.

7. A semiconductor device comprising first and second circuit parts with different structures formed on a semiconductor substrate, wherein said first circuit part comprises;

a first contact hole formed through a first part of an interlayer insulating film formed ins aid semiconductor substrate, a recessed plug of a conductor having its one end electrically connected to said semiconductor substrate and its other end located in a recessed position in said first contact hole, said other end being positioned at a g-value of approximately 0.5, and a first wiring layer being electrically connected with said recessed plug and extending from a position inside said first contact hole over the first part of said interlayer insulating film, and said second circuit part comprises;

a second contact hole formed through a second part of said interlayer insulating film formed on said semiconductor substrate, and a second wiring layer being electrically connected with said semiconductor substrate and extending from a position inside said second contact hole over the second part of said interlayer insulating film, wherein said first circuit part is a data holding part for holding data by accumulating charge in a capacitor, and said second circuit part is a peripheral circuit part configured to function in relation to said data holding part.

8. A semiconductor device comprising first and second circuit parts with different structures formed on a semiconductor substrate, wherein said first circuit part comprises;

a first contact hole formed through a first part of an interlayer insulating film formed in said semiconductor substrate, a recessed plug of a conductor having its one end electrically connected to said semiconductor substrate and its other end located in a recessed position in said first contact hole, said recessed plug is arranged that the other end is located near the center of said first contact hole, and a first wiring layer being electrically connected with said recessed plug and extending from a position inside said first contact hole over the first part of said interlayer insulating film, and said second circuit part comprises;

a second contact hole formed through a second part of said interlayer insulating film formed on said semiconductor substrate, and a second wiring layer being electrically connected with said semiconductor substrate and extending from a position inside said second contact hole over the second part of said interlayer insulating film.

* * * * *